(12) United States Patent
Ochi et al.

(10) Patent No.: US 11,641,740 B2
(45) Date of Patent: May 2, 2023

(54) SEMICONDUCTOR MEMORY DEVICE

(71) Applicant: Kioxia Corporation, Tokyo (JP)

(72) Inventors: Takamitsu Ochi, Kuwana Mie (JP);
Shunsuke Kasashima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 233 days.

(21) Appl. No.: 17/010,181

(22) Filed: Sep. 2, 2020

(65) Prior Publication Data

US 2021/0257383 A1 Aug. 19, 2021

(30) Foreign Application Priority Data

Feb. 14, 2020 (JP) .............................. JP2020-023556

(51) Int. Cl.
*H01L 27/11582* (2017.01)
*H01L 27/11565* (2017.01)
*G11C 16/04* (2006.01)

(52) U.S. Cl.
CPC .... *H01L 27/11582* (2013.01); *G11C 16/0483* (2013.01); *H01L 27/11565* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 2015/0279855 A1 | 10/2015 | Lu et al. | |
| 2016/0104715 A1 | 4/2016 | Pachamuthu et al. | |
| 2016/0190155 A1 | 6/2016 | Lee et al. | |
| 2019/0067314 A1 | 2/2019 | Lu et al. | |
| 2020/0006373 A1* | 1/2020 | Kubo | H01L 21/7688 |

* cited by examiner

*Primary Examiner* — Christopher A Johnson
(74) *Attorney, Agent, or Firm* — Foley & Lardner LLP

(57) ABSTRACT

A device includes conductor layers and a first pillar, extending through the conductor layers, that includes a first columnar portion, a second columnar portion, and a middle portion between the first and second columnar portions. A diameter of the middle portion is larger than a diameter of the first columnar portion and larger than a diameter of the second columnar portion. The first columnar portion includes a first semiconductor layer and a first charge storage layer. The second columnar portion includes a second semiconductor layer and a second charge storage layer. The middle portion includes a third semiconductor layer. The first and second semiconductor layers are in contact with the third semiconductor layer on a first side and a second side of the third semiconductor layer, respectively. The first charge storage layer is spaced from the second charge storage layer.

13 Claims, 24 Drawing Sheets

SEMICONDUCTOR MEMORY DEVICE

CROSS-REFERENCE TO RELATED APPLICATION(S)

This application is based upon and claims the benefit of priority from Japanese Patent Application No. 2020-023556, filed Feb. 14, 2020, the entire contents of which are incorporated herein by reference.

FIELD

Embodiments described herein relate generally to a semiconductor memory device.

BACKGROUND

There are NAND flash memory capable of storing data in a nonvolatile manner.

DETAILED DESCRIPTION

Figure 1:
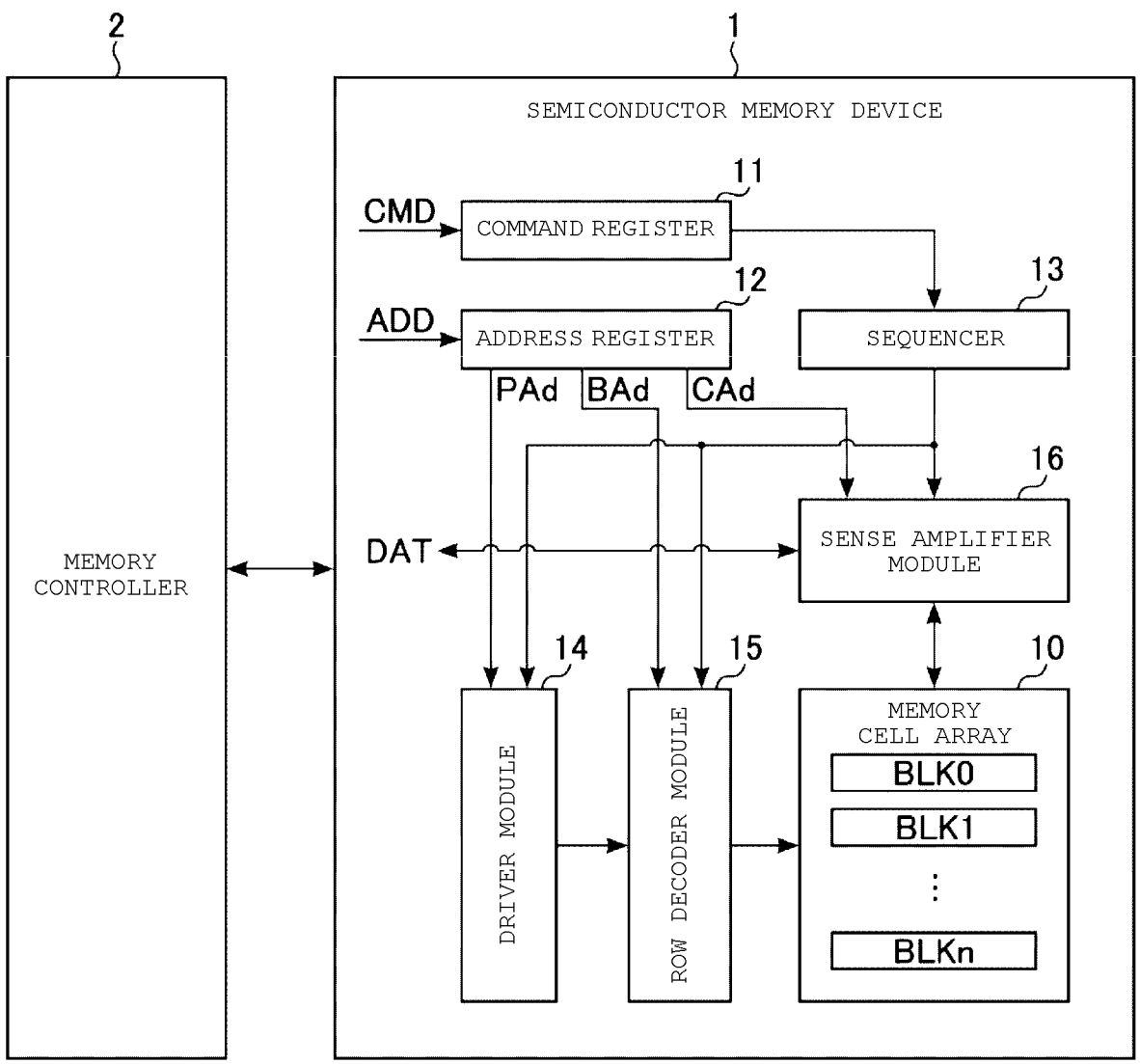
FIG. 1 is a block diagram illustrating a configuration example of a semiconductor memory device according to a first embodiment.

Embodiments provide a semiconductor memory device capable of preventing deterioration in electrical characteristics.

In general, according to one embodiment, there is provided a semiconductor memory device. The semiconductor memory device includes a plurality of conductor layers. The semiconductor memory device includes a first pillar, extending through the plurality of conductor layers, that includes a first columnar portion, a second columnar portion, and a middle portion interposed between the first columnar portion and the second columnar portion. A diameter of the middle portion is larger than a diameter of the first columnar portion and larger than a diameter of the second columnar portion. The first columnar portion includes a first semiconductor layer and a first charge storage layer. The first charge storage layer is located between the plurality of conductor layers and the first semiconductor layer. The second columnar portion includes a second semiconductor layer and a second charge storage layer. The second charge storage layer is located between the plurality of conductor layers and the second semiconductor layer. The middle portion includes a third semiconductor layer. The first semiconductor layer is in contact with the third semiconductor layer on a first side of the third semiconductor layer. The second semiconductor layer is in contact with the third semiconductor layer on a second side of the third semiconductor layer opposite to the first side. The second semiconductor layer and the third semiconductor layer are formed as a continuous film. The first charge storage layer is spaced from the second charge storage layer.

Embodiments will be described below with reference to the drawings. Each embodiment exemplifies an apparatus or a method of embodying a technical idea of the present disclosure. The drawings are schematic or conceptual, and dimensions and proportions of the drawings are not always the same as the actual dimensions and proportions. The entire description of one embodiment is also applied to a description of another embodiment, unless explicitly or obviously is excluded. The technical idea of the present disclosure is not specified by shapes, structures, arrangements, or the like of components.

In the following description, components having substantially the same functions and configurations are denoted by the same reference numerals. The numbers after letters of the reference numerals are referenced by the reference numerals including the same letters, and are used to distinguish the components having the same configuration. When it is not necessary to distinguish the components indicated by the reference numerals including the same letter from each other, each of the components is referenced by the reference numeral including only the letter.

1. First Embodiment

1-1. Configuration (Structure)

Hereinafter, a semiconductor memory device 1 according to an embodiment will be described with reference to the drawings.

1-1-1. Configuration of Semiconductor Memory Device 1

FIG. 1 illustrates a configuration example of a semiconductor memory device 1 according to an embodiment. The semiconductor memory device 1 is a NAND flash memory capable of storing data in a nonvolatile manner. The semiconductor memory device 1 is controlled by an external memory controller 2.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer equal to or larger than one). The block BLK includes a set of a plurality of memory cell transistors MT (not illustrated) capable of storing data in a nonvolatile manner, and is used as, for example, a data erasing unit. A plurality of source lines SL, a plurality of word lines WL, a plurality of bit lines BL, and the like (not illustrated) are connected to the memory cell array 10. Each memory cell transistor is associated with, for example, one bit line BL and one word line WL. A detailed configuration of the memory cell array 10 will be described later.

The command register 11 stores a command CMD, which is received by the semiconductor memory device 1 from the memory controller 2. The command CMD includes, for example, an instruction that causes the sequencer 13 to execute a read operation, a write operation, an erasing operation, or the like.

The address register 12 stores address information ADD that the semiconductor memory device 1 receives from the memory controller 2. The address information ADD includes, for example, a block address BAd, a page address PAd, and a column address CAd. For example, the block address BAd, the page address PAd, and the column address CAd are respectively used to select the block BLK, the word line WL, and the bit line BL.

The sequencer 13 controls the overall operation of the semiconductor memory device 1. For example, the sequencer 13 executes a read operation, a write operation, an erasing operation, or the like by controlling the driver module 14, the row decoder module 15, the sense amplifier module 16, and the like based on the command CMD stored in the command register 11.

The driver module 14 generates a voltage used in a read operation, a write operation, an erasing operation, or the like, and supplies the generated voltage to the row decoder module 15. The driver module 14 applies the generated voltage to a signal line corresponding to the selected word line WL based on, for example, the page address PAd stored in the address register 12.

The row decoder module 15 selects one block BLK in the memory cell array 10 based on the block address BAd stored in the address register 12. The row decoder module 15 transmits, for example, the voltage applied to the signal line connected to the selected word line WL, to the selected word line WL in the selected block BLK.

In the write operation, the sense amplifier module 16 applies a voltage, which is determined according to write data DAT received from the memory controller 2, to each bit line BL. Further, in the read operation, the sense amplifier module 16 determines the data stored in the memory cell transistor MT based on the voltage of the bit line BL, and transmits the determination result to the memory controller 2, as read data DAT.

The semiconductor memory device 1 and the memory controller 2 described above may be combined into one semiconductor device. Examples of such a semiconductor device include a memory card such as an SD (registered trademark) card, a solid state drive (SSD), and the like.

1-1-2. Circuit Configuration of Memory Cell Array 10

Figure 2:
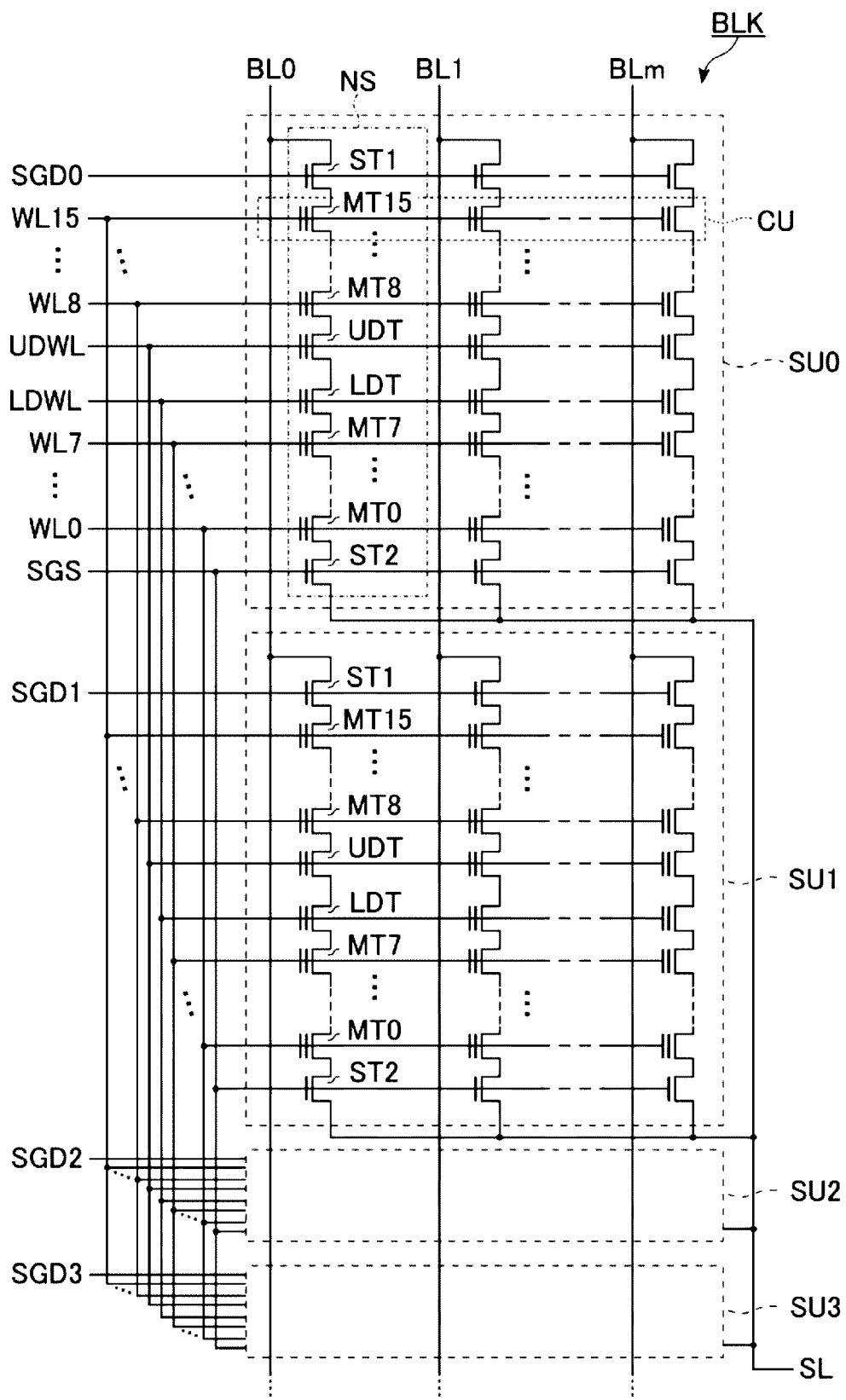
FIG. 2 is a circuit diagram illustrating an example of a circuit configuration of a memory cell array in the semiconductor memory device according to the first embodiment.

FIG. 2 illustrates an example of a circuit configuration of the memory cell array 10 in the semiconductor memory device 1 according to the embodiment, and illustrates one block BLK extracted from the plurality of blocks BLK in the memory cell array 10. All other blocks BLK also include components and connections illustrated in FIG. 2. The number of blocks BLK in the memory cell array 10 and the number of string units SU in one block BLK may be set to any number. The following description is based on an example in which one block BLK includes four string units SU0 to SU3.

Each string unit SU is a set of a plurality of NAND strings NS respectively associated with the bit lines BL0 to BLm (m is an integer equal to or larger than one). Each NAND string NS includes a plurality of memory cell transistors, for example, memory cell transistors MT0 to MT15, dummy transistors LDT and UDT, and select transistors ST1 and ST2. The following description is based on an example in which each NAND string NS includes 16 memory cell transistors MT0 to MT15.

The memory cell transistor MT includes a control gate and a charge storage layer, and stores data in a nonvolatile manner. Each of the dummy transistors LDT and UDT has the same configuration as, for example, the memory cell transistor MT, and is a memory cell transistor that is not used to store data. Each of the select transistors ST1 and ST2 is used to select the string unit SU in various operations.

In each NAND string NS, the memory cell transistors MT0 to MT7 are connected in series. The memory cell transistors MT8 to MT15 are connected in series. A drain of the select transistor ST1 is connected to the associated bit line BL, and a source of the select transistor ST1 is connected to one end of a set of the memory cell transistors MT8 to MT15. The other end of the set of the memory cell transistors MT8 to MT15 is connected to a drain of the dummy transistor UDT. A source of the dummy transistor UDT is connected to a drain of the dummy transistor LDT. A source of the dummy transistor LDT is connected to one end of a set of the memory cell transistors MT0 to MT7. The other end of the set of the memory cell transistors MT0 to MT7 is connected to a drain of the select transistor ST2. A source of the select transistor ST2 is connected to the source line SL.

In the same block BLK, control gates of the memory cell transistors MT0 to MT15 are commonly connected to each of the word lines WL0 to WL15. Control gates of the dummy transistors UDT are commonly connected to a dummy word line UDWL. Control gates of the dummy transistors LDT are commonly connected to a dummy word line LDWL. Gates of the select transistors ST1 in each of the string units SU0 to SU3 are commonly connected to each of select gate lines SGD0 to SGD3. Gates of the select transistors ST2 are commonly connected to a select gate line SGS.

One NAND string NS of each string unit SU is connected to one bit line BL. The source line SL is shared between, for example, the plurality of blocks BLK.

A set of the plurality of memory cell transistors MT connected to the common word line WL in one string unit SU is called, for example, a cell unit CU. For example, storage capacitance of the cell unit CU, which includes the memory cell transistors MT each in which 1-bit data is stored, is defined as "1-page data". The cell unit CU may have storage capacitance of 2-page data or larger according to the number of bits of the data stored in the memory cell transistor MT.

The circuit configuration of the memory cell array 10 in the semiconductor memory device 1 according to the embodiment is not limited to the above-described configuration. For example, the number of the memory cell transistors MT and the select transistors ST1 and ST2 in each NAND string NS may be any number.

1-1-3. Planar Structure of Memory Cell Array 10

Hereinafter, an example of a structure of the memory cell array 10 according to the embodiment will be described. In the drawings referred to below, a y direction corresponds to an extending direction of the bit line BL, an x direction corresponds to an extending direction of the word line WL, and a z direction corresponds to a vertical direction with respect to a front surface of a semiconductor substrate 20 (not illustrated) on which the semiconductor memory device 1 is formed. Hatching is appropriately added to the plan view for easy understanding of the drawing. The hatching added to the plan view is not necessarily related to a material and a characteristic of the hatched component. In the sectional view, components such as an insulator layer (interlayer insulating film), wiring, and a contact are omitted for easier understanding.

Figure 3:
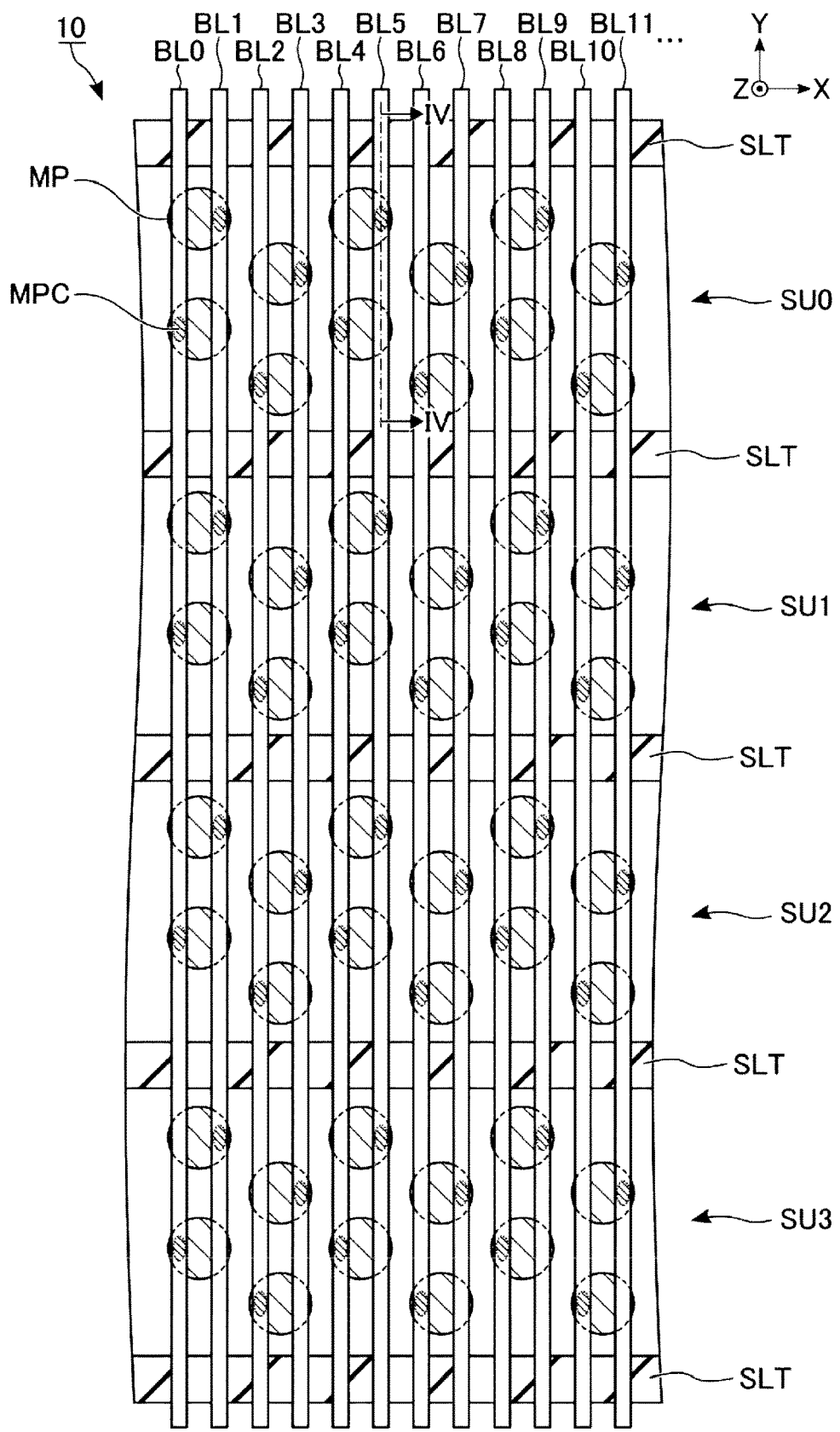
FIG. 3 is a plan view illustrating an example of a planar layout of the memory cell array in the semiconductor memory device according to the first embodiment.

FIG. 3 is an example of a planar layout of the memory cell array 10 in the semiconductor memory device 1 according to a first embodiment, and illustrates an extracted region including structures that function as the string units SU0 to SU3. As illustrated in FIG. 3, the memory cell array 10 includes, for example, slits SLT, memory pillars MP, contacts MPC, and bit lines BL.

Each of a plurality of slits SLT extends in the x direction, and is arranged in the y direction. The slit SLT includes an insulator. The slit SLT slits wiring layers functioning as the word lines WL, a wiring layer functioning as the select gate line SGD, and a wiring layer functioning as the select gate line SGS.

A region divided by the slit SLT functions as one string unit SU. Specifically, for example, the slits SLT are respectively arranged between the string units SU0 and SU1 adjacent to each other in the y direction, between the string units SU1 and SU2 adjacent to each other in the y direction, and between the string units SU2 and SU3 adjacent to each other in the y direction. In the memory cell array 10, for example, a layout similar to the layout illustrated in FIG. 3 is repeatedly arranged in the y direction.

A plurality of memory pillars MP are arranged in, for example, four rows in a zigzag pattern in the region that functions as, for example, the string unit SU. The number and arrangement of the memory pillars MP between the adjacent slits SLT are not limited thereto, and may be changed as appropriate. Each of the memory pillars MP functions as, for example, one NAND string NS.

Each of the plurality of bit lines BL extends in the y direction, and is arranged in the x direction. Each bit line BL is arranged so as to overlap with at least one memory pillar MP for each string unit SU. For example, each memory pillar MP overlaps with two bit lines BL. The contact MPC is provided between one bit line BL of the plurality of bit lines BL that overlaps with the memory pillar MP and the memory pillar MP. Each memory pillar MP is electrically connected to one bit line BL via the contact MPC. In each region divided by the slit SLT, one contact MPC is connected to one bit line BL. The number of the bit lines BL overlapping with each memory pillar MP may be any number.

1-1-4. Sectional Structure of Memory Cell Array 10

Figure 4:
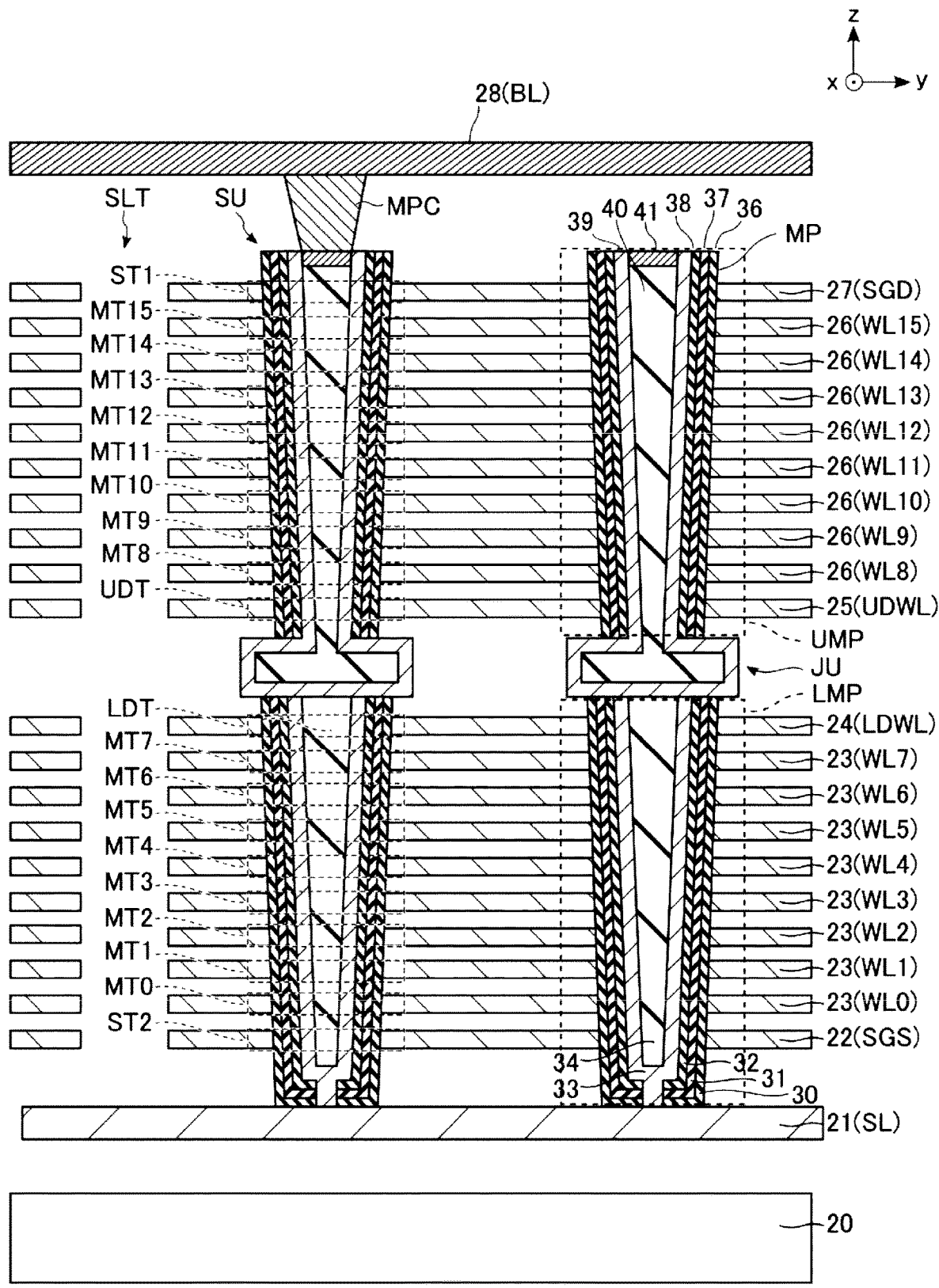
FIG. 4 is a sectional view taken along a line IV-IV of FIG. 3, illustrating an example of a sectional structure of the memory cell array in the semiconductor memory device according to the first embodiment.

FIG. 4 is a sectional view taken along a line IV-IV of FIG. 3, and illustrates an example of a sectional structure of the memory cell array 10 in the semiconductor memory device 1 according to the first embodiment. As illustrated in FIG. 4, the memory cell array 10 includes, for example, conductor layers 21 to 28, the memory pillars MP, the contacts MPC, and the slits SLT. The conductor layers 21 to 28 are provided above the semiconductor substrate 20. Hereinafter, the sectional structure of the memory cell array 10 will be described. In FIG. 4, for easy understanding of the drawing, insulator layers may be omitted.

The conductor layer 21 is provided above the semiconductor substrate 20 with an insulator layer interposed therebetween. Although not illustrated, a circuit such as the sense amplifier module 16 is provided in the insulator layer between the semiconductor substrate 20 and the conductor layer 21. The conductor layer 21 is formed, for example, in a plate shape spreading along an xy plane, and is used as the source line SL. The conductor layer 21 includes, for example, silicon (Si).

The conductor layer 22 is provided above the conductor layer 21 with an insulator layer interposed therebetween. The conductor layer 22 is formed, for example, in a plate shape spreading along the xy plane, and is used as the select gate line SGS. The conductor layer 22 includes, for example, tungsten (W).

Insulator layers and conductor layers 23 are alternately stacked above the conductor layer 22. The conductor layer 23 is formed, for example, in a plate shape spreading along the xy plane. For example, a plurality of the stacked conductor layers 23 are used as the word lines WL0 to WL7 in order from the semiconductor substrate 20 side. The conductor layer 23 includes, for example, tungsten.

The conductor layer 24 is provided above the uppermost conductor layer 23 with an insulator layer interposed therebetween. The conductor layer 24 is formed, for example, in a plate shape spreading along the xy plane, and is used as the dummy word line LDWL. The conductor layer 24 includes, for example, tungsten.

The conductor layer 25 is provided above the conductor layer 24 with an insulator layer interposed therebetween. The conductor layer 25 is formed, for example, in a plate shape spreading along the xy plane, and is used as the dummy word line UDWL. The conductor layer 25 includes, for example, tungsten (W).

Insulator layers and conductor layers 26 are alternately stacked above the conductor layer 25. The conductor layer 26 is formed, for example, in a plate shape spreading along the xy plane. For example, a plurality of the stacked conductor layers 26 are used as the word lines WL8 to WL15 in order from the semiconductor substrate 20 side. The conductor layer 26 includes, for example, tungsten.

The conductor layer 27 is provided above the uppermost conductor layer 26 with an insulator layer interposed therebetween. The conductor layer 27 is formed, for example, in a plate shape spreading along the xy plane, and is used as the select gate line SGD. The conductor layer 27 includes, for example, tungsten.

The conductor layer 28 is provided above the conductor layer 27 with an insulator layer interposed therebetween. The conductor layer 28 is formed, for example, in a line shape extending along the y direction, and is used as the bit line BL. In a region (not illustrated), a plurality of conductor layers 28 are arranged along the x direction. The conductor layer 28 includes, for example, copper (Cu).

Each of the plurality of memory pillars MP extends along the z direction, penetrates the conductor layers 22 to 27, and is in contact with the conductor layer 21 at the bottom.

Further, the memory pillar MP includes a plurality of connected columnar portions. Specifically, the memory pillar MP includes, for example, a lower pillar LMP, an upper pillar UMP, and a joint portion JU (or a middle portion) between the lower pillar LMP and the upper pillar UMP. The upper pillar UMP is provided on the lower pillar LMP, and the lower pillar LMP and the upper pillar UMP are joined to each other through the joint portion JU.

The lower pillar LMP includes, for example, a block insulating film 30, an insulating film 31, a tunnel insulating film 32, a semiconductor layer 33, and a core member 34. The upper pillar UMP includes, for example, a block insulating film 36, an insulating film 37, a tunnel insulating film 38, a semiconductor layer 39, a core member 40, and a semiconductor layer 41. The joint portion JU includes, for example, a semiconductor layer 39 and a core member 40.

Specifically, the core member 34 extends along the Z direction, and is provided at the center portion of the lower pillar LMP. For example, an upper end of the core member 34 is disposed in a layer above the layer in which the conductor layer 24 is provided, and a bottom end of the core member 34 is disposed in a layer below the layer in which the conductor layer 22 is provided. The core member 34 includes an insulator such as silicon oxide ($SiO_2$).

The semiconductor layer 33 includes, for example, a portion that covers a side surface and a bottom surface of the core member 34, and a columnar portion that extends in the z direction below the bottom surface of the core member 34. For example, a bottom surface of the columnar portion of the semiconductor layer 33 is in contact with the conductor layer 21. The semiconductor layer 33 includes silicon, for example, undoped silicon.

The tunnel insulating film 32 covers a side surface and a bottom surface of the semiconductor layer 33 except a portion of a side surface of the columnar portion of the semiconductor layer 33. The tunnel insulating film 32 includes, for example, silicon oxide. The insulating film 31 covers a side surface and a bottom surface of the tunnel insulating film 32. The insulating film 31 includes, for example, silicon nitride (SiN) The block insulating film 30 covers a side surface and a bottom surface of the insulating film 31. The block insulating film 30 includes, for example, silicon oxide.

Further, the core member 40 includes a portion of the upper pillar UMP and a portion of the joint portion JU. The portion of the core member 40 in the upper pillar UMP extends along the Z direction, and is provided at the center portion of the upper pillar UMP. An upper end of the portion of the core member 40 in the upper pillar UMP is disposed in a layer above the layer in which the conductor layer 27 is provided.

The portion of the core member 40 in the joint portion JU is provided at the center portion of the joint portion JU. The portion of the core member 40 in the joint portion JU is disposed in, for example, a layer provided between the conductor layers 24 and 25. The portion of the core member 40 in the joint portion JU is thicker than the portion of the core member 40 in the upper pillar UMP. Details will be described later with reference to FIG. 5. The core member 40 includes an insulator such as silicon oxide, and includes, for example, substantially the same material as the core member 34.

The semiconductor layer 39 covers the periphery of the core member 40 in, for example, the upper pillar UMP and the joint portion JU. That is, the semiconductor layer 39 covers side surfaces of the core member 40 in the upper pillar UMP, and covers, in the joint portion JU, an upper surface, side surfaces, and a bottom surface of the portion of the core member 40 in the joint portion JU. For example, in the upper pillar UMP and the joint portion JU, the semiconductor layer 39 is continuously provided to have approximately the same thickness. In this specification, "approximately the same thickness" is intended to mean that while the thicknesses are generally the same, thicknesses may not exactly the same due to a variation in manufacturing process. The semiconductor layer 39 may have approximately the same thickness as, for example, the thickness of the semiconductor layer 33. A bottom surface of the semiconductor layer 39 is disposed in a layer provided between, for example, the conductor layers 24 and 25. Further, the bottom surface of the semiconductor layer 39 is in contact with, for example, upper surfaces of the block insulating film 30, the insulating film 31, the tunnel insulating film 32, the semiconductor layer 33, and the core member 34 of the lower pillar LMP. The semiconductor layer 39 and the semiconductor layer 33 are electrically connected to each other. The semiconductor layer 39 includes silicon, for example, undoped silicon. The semiconductor layer 39 includes, for example, substantially the same material as the semiconductor layer 33.

The tunnel insulating film 38 covers a side surface of the semiconductor layer 39 in the upper pillar UMP. The tunnel insulating film 38 includes, for example, silicon oxide, and includes, for example, substantially the same material as the tunnel insulating film 32. The insulating film 37 covers a side surface of the tunnel insulating film 38. The insulating film 37 includes, for example, silicon nitride, and includes, for example, substantially the same material as the insulating film 31. The block insulating film 36 covers a side surface of the insulating film 37. The block insulating film 36 includes, for example, silicon oxide, and includes, for example, substantially the same material as the block insulating film 30. The semiconductor layer 41 is disposed in a layer above the conductor layer 27. A side surface of the semiconductor layer 41 is in contact with, for example, an inner wall of the semiconductor layer 39, and a bottom surface of the semiconductor layer 41 is in contact with, for example, an upper surface of the core member 40. The semiconductor layer 41 and the semiconductor layer 39 are electrically connected to each other. The semiconductor layer 41 includes, for example, the same material as the semiconductor layers 33 and 39.

The contact MPC having a columnar shape is provided on upper surfaces of the semiconductor layers 39 and 41 in the memory pillar MP. In the region illustrated in FIG. 4, the contact MPC connected to one of the two memory pillars MP is displayed. Another contact MPC in a region not illustrated in FIG. 4 is connected to the memory pillar MP to which the contact MPC is not connected in the region illustrated in FIG. 4. One conductor layer 28, that is, one bit line BL is in contact with an upper surface of the contact MPC.

The slit SLT is formed, for example, in a plate shape spreading along the xz plane, and slits the conductor layers 22 to 27. An upper end of the slit SLT which is not illustrated is disposed in a layer between the conductor layer 27 and the conductor layer 28. A bottom end of the slit SLT is disposed, for example, in a layer in which the conductor layer 21 is provided. The slit SLT includes, for example, an insulator such as silicon oxide.

In the above-described structure of the memory pillar MP, a portion in which the memory pillar MP intersects with the conductor layer 22 functions as the select transistor ST2. A portion in which the memory pillar MP intersects with each of the conductor layers 23 and 26 functions as the memory cell transistor MT. A portion in which the memory pillar MP intersects with the conductor layer 24 functions as the dummy transistor LDT. A portion in which the memory pillar MP intersects with the conductor layer 25 functions as the dummy transistor UDT. A portion in which the memory pillar MP intersects with the conductor layer 27 functions as the select transistor ST1.

That is, the semiconductor layers 33 and 39 are used as a channel of each of the memory cell transistors MT, the select transistors ST1 and ST2, and the dummy transistors LDT and UDT. The insulating films 31 and 37 are used as a charge storage layer of the memory cell transistor MT. Thereby, each of the memory pillars MP can function as one NAND string NS.

As illustrated in FIG. 4, each of the select transistor ST2, the memory cell transistors MT0 to MT7, and the dummy transistor LDT is formed in the lower pillar LMP. Further, each of the dummy transistor UDT, the memory cell transistors MT8 to MT15, and the select transistor ST1 is formed in the upper pillar UMP.

Figure 5:
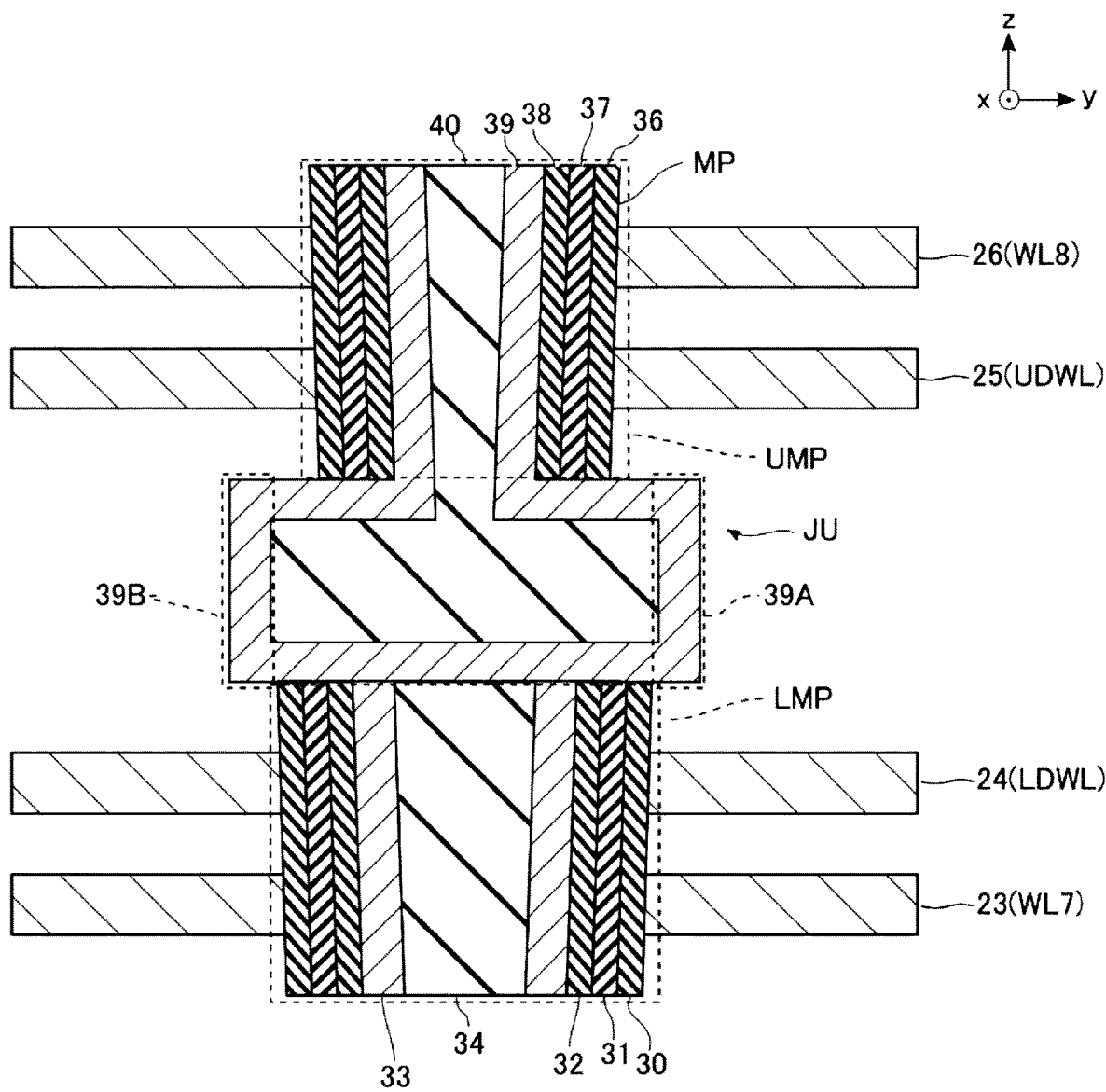
FIG. 5 is an enlarged view of a part of FIG. 4.

FIG. 5 is an enlarged view of a part of FIG. 4. The structure of the joint portion JU and the vicinity of the joint portion JU will be further described with reference to FIG. 5. The core member 40 is thicker in the joint portion JU than in the upper pillar UMP. Thus, the semiconductor layer 39 covering the side surface of the core member 40 protrudes toward an outer circumference of the memory pillar MP. In other words, side surface portions 39A and 39B of the semiconductor layer 39 in the joint portion JU protrude toward the outer circumference of the memory pillar MP more than the semiconductor layer 39 in the upper pillar UMP and the semiconductor layer 33 in the lower pillar LMP. Specifically, for example, the side surface portions 39A and 39B of the semiconductor layer 39 in the joint portion JU protrude toward the outer circumference of the memory pillar MP by at least the total thickness of the block insulating film 30, the insulating film 31, and the tunnel insulating film 32 from an outer surface of the semiconductor layer 33 in the lower pillar LMP. Since the side surface portions 39A and 39B of the semiconductor layer 39 in the joint portion JU protrude toward the outer circumference of the memory pillar MP, the side surface portions 39A and 39B of the semiconductor layer 39 in the joint portion JU are closer to the conductor layers 24 and 25 than the side surface portions of the semiconductor layer 39 in the upper pillar UMP and the lower pillar LMP. As described above, the semiconductor layer 39 and the semiconductor layer 33 may have approximately the same thickness, for example, over the entire memory pillar MP.

FIG. 5 illustrates that a diameter of a lower end of the upper pillar UMP is smaller than a diameter of an upper end of the lower pillar LMP. This is because the upper pillar UMP and the lower pillar LMP have a taper shape in the drawings used for the description of the first embodiment. On the other hand, the shape of the memory pillar MP according to the first embodiment is not limited to the taper shape, and the memory pillar MP may have, for example, a shape in which the outer diameter does not change depending on a position of the layer, an inverted taper shape, or a shape in which the middle portion is swollen.

1-2. Method of Manufacturing Semiconductor Memory Device 1

Figure 6:
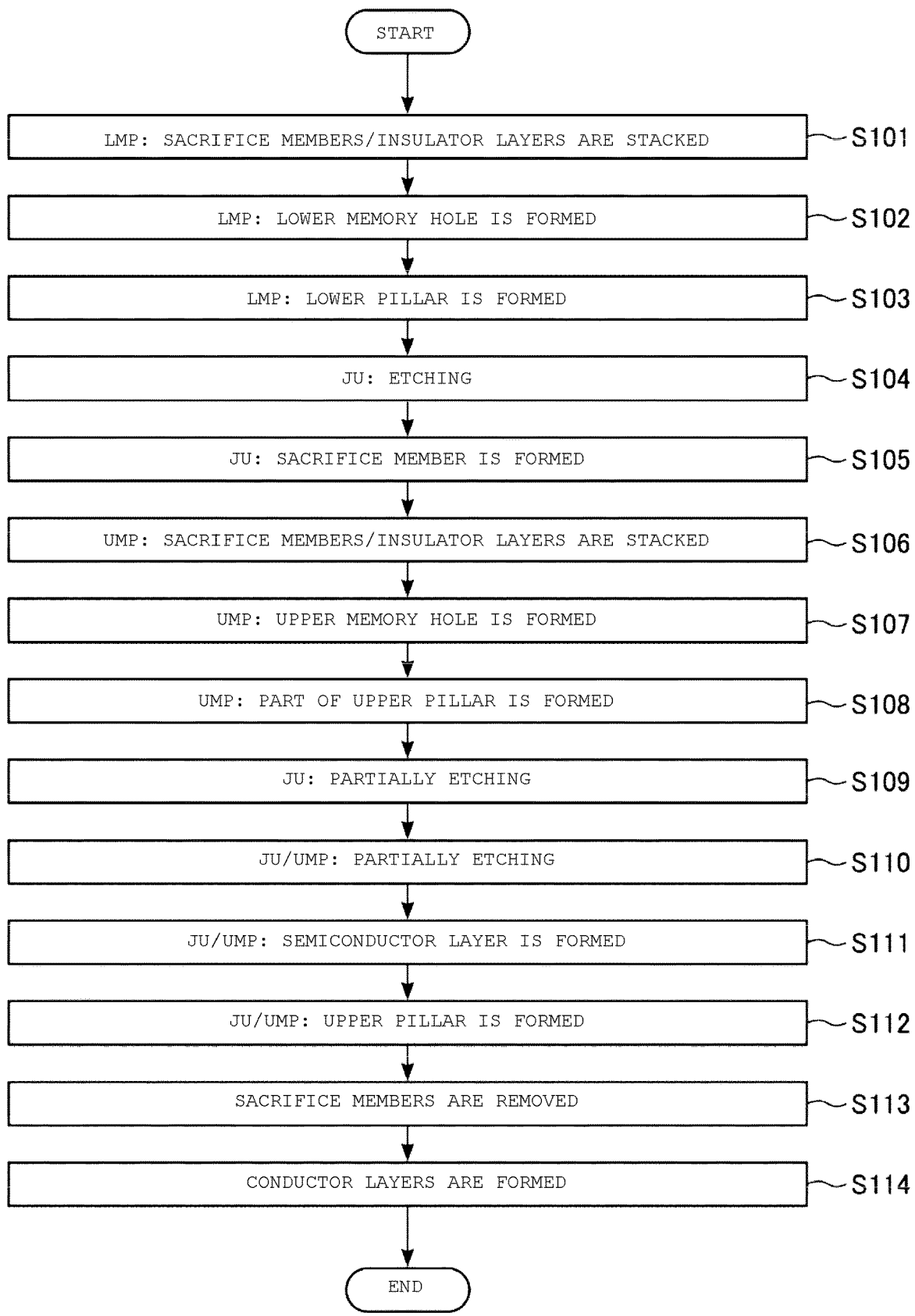
FIG. 6 is a flowchart illustrating an example of a method of manufacturing the semiconductor memory device according to the first embodiment.

Hereinafter, an example of a series of a manufacturing process for forming the stacked wiring structure in the memory cell array 10 of the semiconductor memory device 1 according to the first embodiment will be described with reference to FIG. 6. FIG. 6 is a flowchart illustrating an example of a method of manufacturing the semiconductor memory device according to the first embodiment. Each of FIGS. 7 to 20 is an example of the sectional structure of the semiconductor memory device 1 according to the first embodiment in the manufacturing step, and illustrates the same section as FIG. 4.

Figure 7:
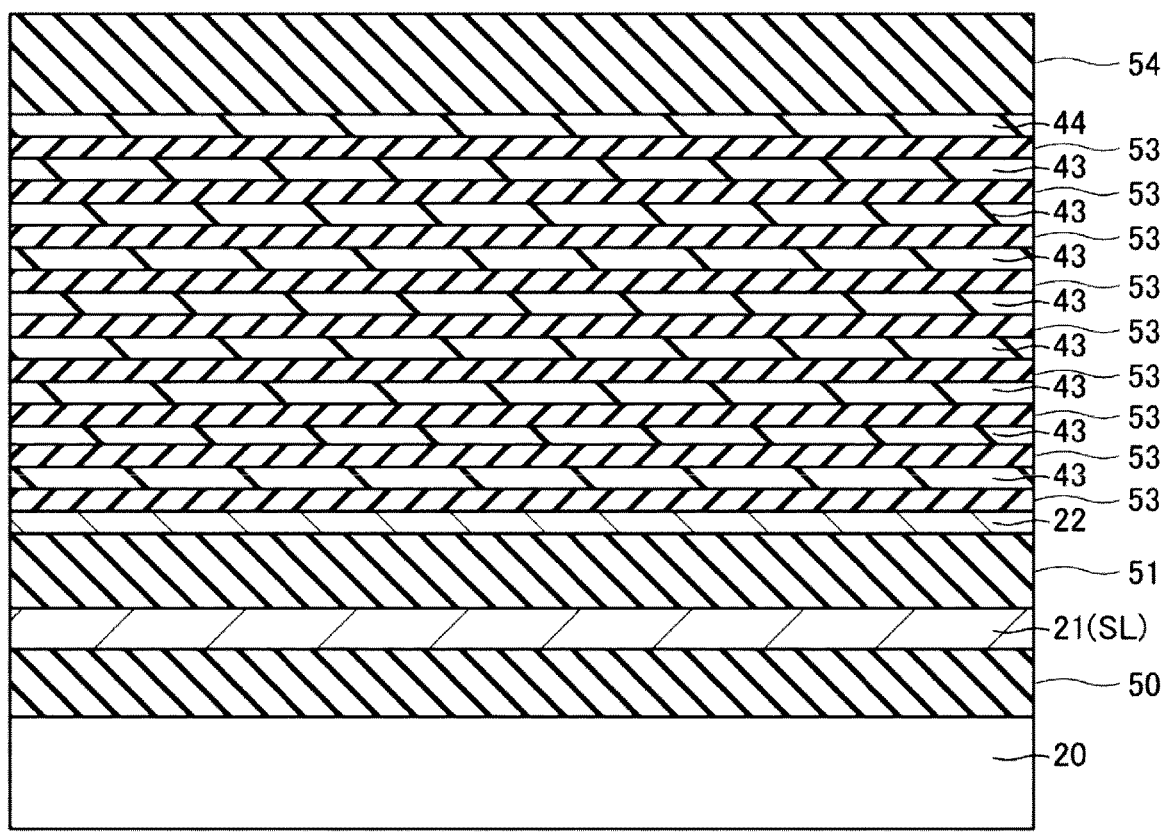
FIG. 7 is a sectional view of the memory cell array illustrating an example of a sectional structure of the semiconductor memory device according to the first embodiment in manufacturing steps.

First, as illustrated in FIG. 7, sacrifice members 43 and 44 are stacked (step S101). The sacrifice members 43 and 44 are formed in regions in which the conductor layers 23 and 24 respectively functioning as the word line WL and the dummy word line LDWL are to be formed. Specifically, first, an insulator layer 50, a conductor layer 21, an insulator layer 51, and a conductor layer 22 are sequentially stacked on the semiconductor substrate 20. Thereafter, insulator layers 53 and sacrifice members 43 are alternately stacked on the conductor layer 22, and a sacrifice member 44 is formed on the uppermost insulator layer 53. An insulator layer 54 is formed on the sacrifice member 44. For example, the number of layers in which the sacrifice members 43 are formed is equal to the number of the word lines WL stacked in the lower pillar LMP.

Each of the insulator layers 50, 51, 53, and 54 includes, for example, silicon oxide. The sacrifice members 43 and 44 include, for example, silicon nitride.

Figure 8:
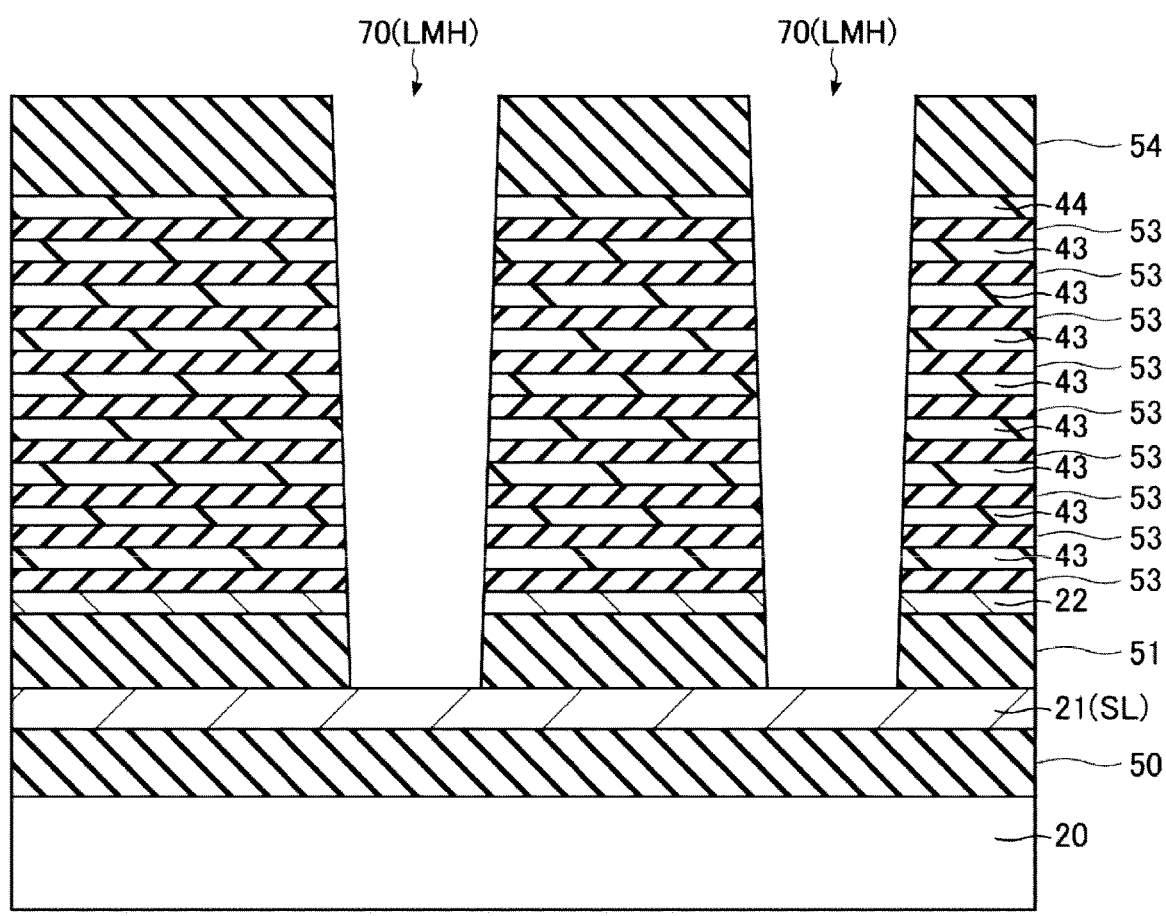
FIG. 8 is a sectional view of the memory cell array illustrating an example of a sectional structure of the semiconductor memory device according to the first embodiment in manufacturing steps.

Next, as illustrated in FIG. 8, a lower memory hole (LMH) 70 is formed (step S102). Specifically, first, by photolithography or the like, a mask which has an opening in a region in which the lower memory hole (LMH) 70 is to be formed is formed. Then, the lower memory hole (LMH) 70 is formed by anisotropic etching using the formed mask.

The lower memory hole (LMH) 70 penetrates each of the insulator layers 51, 53, and 54, the sacrifice members 43 and 44, and the conductor layer 22, and a bottom portion of the lower memory hole (LMH) 70 is stopped at, for example, the conductor layer 21. The anisotropic etching in this step is, for example, reactive ion etching (RIE).

Figure 9:
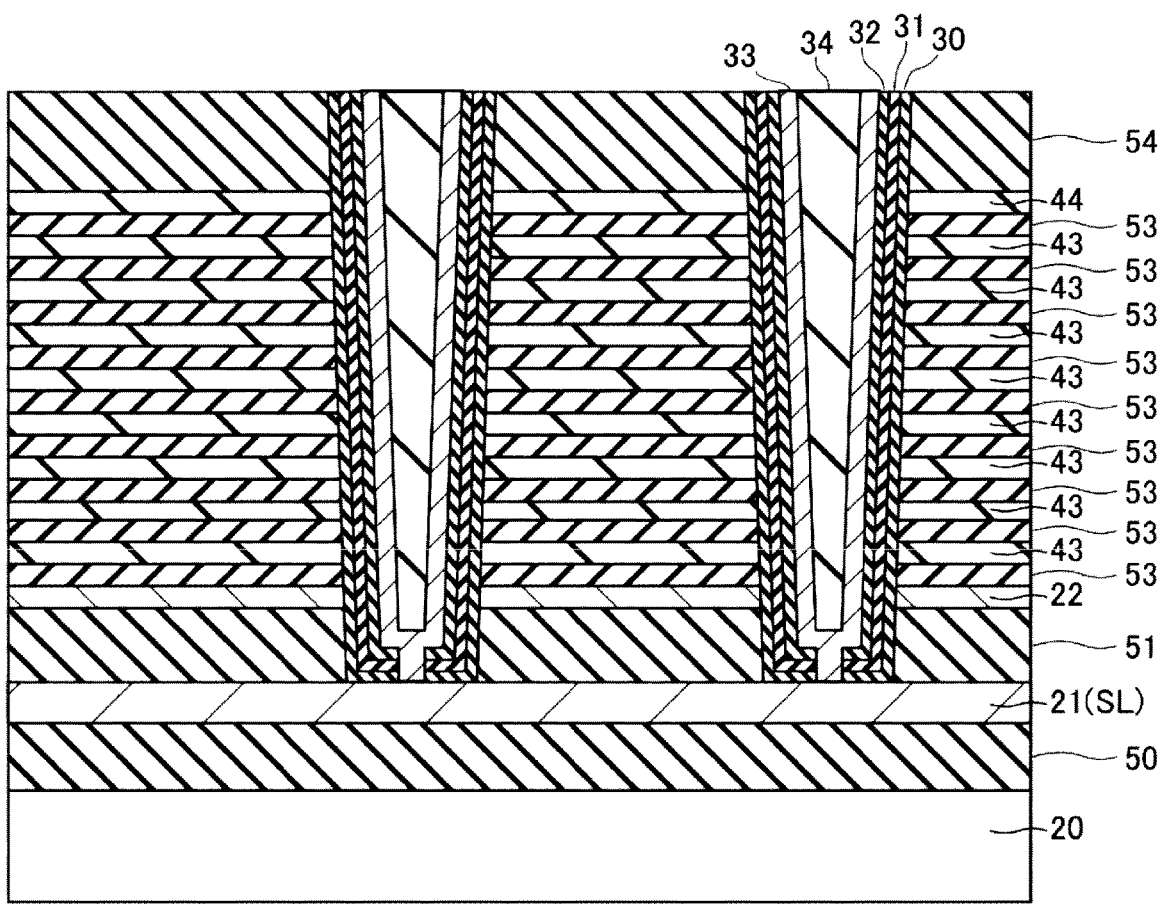
FIG. 9 is a sectional view of the memory cell array illustrating an example of a sectional structure of the semiconductor memory device according to the first embodiment in manufacturing steps.

Next, as illustrated in FIG. 9, a stacked structure is formed in the lower memory hole (LMH) 70 (step S103). Specifically, a block insulating film 30, an insulating film 31, and a tunnel insulating film 32 are sequentially formed on a side surface and a bottom surface of the lower memory hole (LMH) 70. Then, the block insulating film 30, the insulating film 31, and the tunnel insulating film 32 at the bottom portion of the lower memory hole (LMH) 70 are partially removed.

Thereafter, a semiconductor layer 33 is formed on a front surface of the tunnel insulating film 32 in the lower memory hole (LMH) 70. The semiconductor layer 33 fills the region in which the block insulating film 30, the insulating film 31, and the tunnel insulating film 32 are removed at the bottom portion of the lower memory hole (LMH) 70, and is in contact with the conductor layer 21. Further, a core member 34 is formed, and the inside of the lower memory hole (LMH) 70 is filled with the core member 34. Thereby, a lower pillar LMP is formed in a part of the lower memory hole (LMH) 70.

Figure 10:
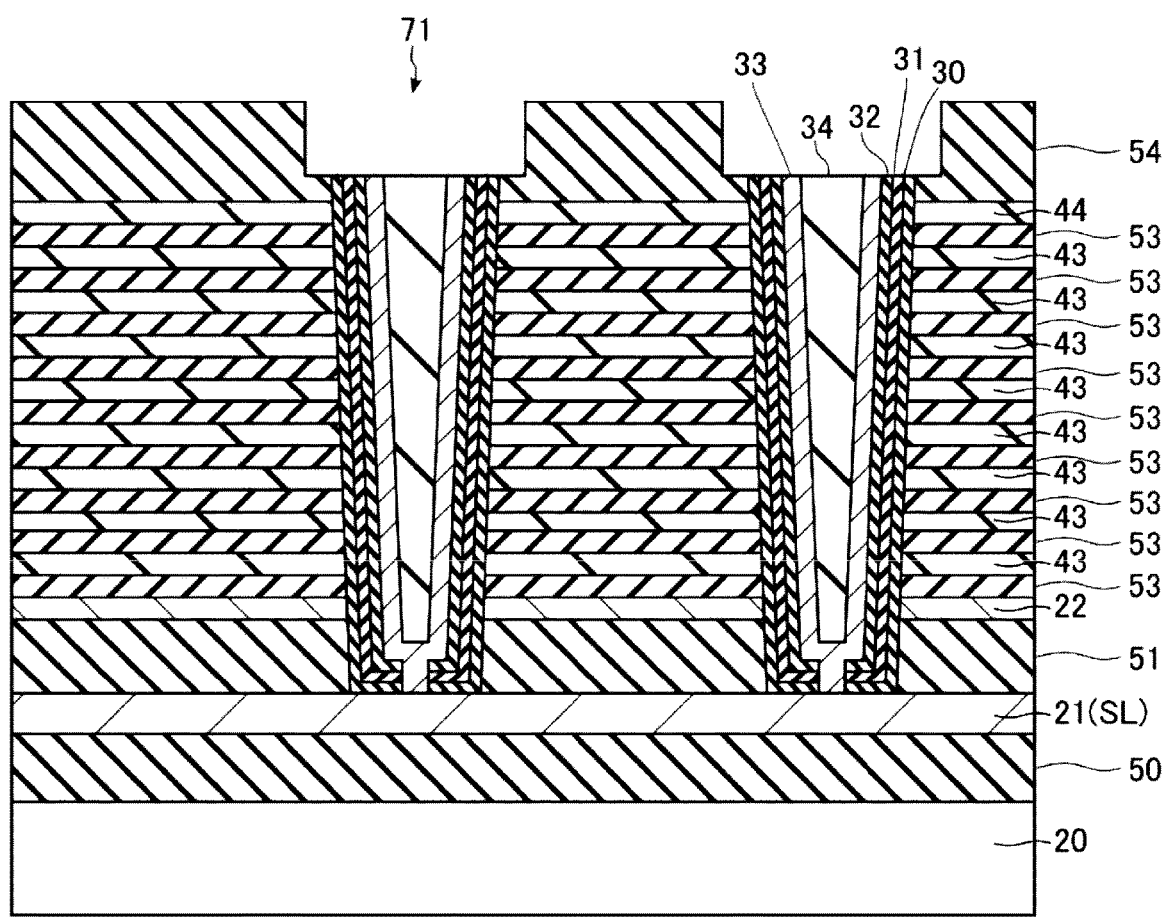
FIG. 10 is a sectional view of the memory cell array illustrating an example of a sectional structure of the semiconductor memory device according to the first embodiment in manufacturing steps.

Next, as illustrated in FIG. 10, a region in which the joint portion JU is to be formed is etched (step S104). Specifically, the core member 34 is etched back along the z direction to a depth at which the joint portion JU is to be formed. Subsequently, the semiconductor layer 33 is etched along the z direction, for example, to a depth around which the joint portion JU is to be formed.

Thereafter, the block insulating film 30, the insulating film 31, the tunnel insulating film 32, and the insulator layer 54 are etched along the y direction to the region in which the joint portion JU is to be formed. Thereby, a space 71 is formed in the region in which the joint portion JU is to be formed.

Figure 11:
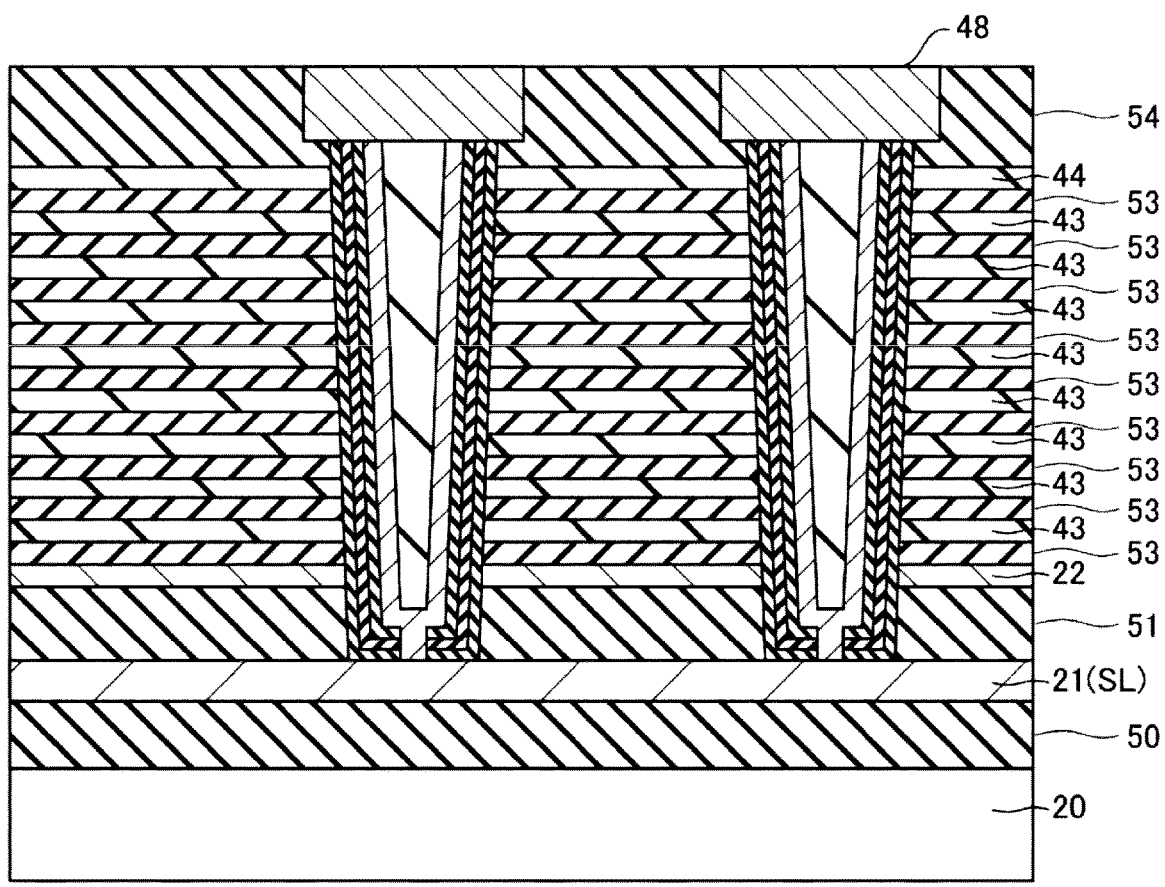
FIG. 11 is a sectional view of the memory cell array illustrating an example of a sectional structure of the semiconductor memory device according to the first embodiment in manufacturing steps.

Next, as illustrated in FIG. 11, a sacrifice member 48 is formed in the space 71 (step S105). Specifically, the space 71 formed in step S103 is filled with the sacrifice member 48. The sacrifice member 48 includes silicon, for example, undoped silicon.

Figure 12:
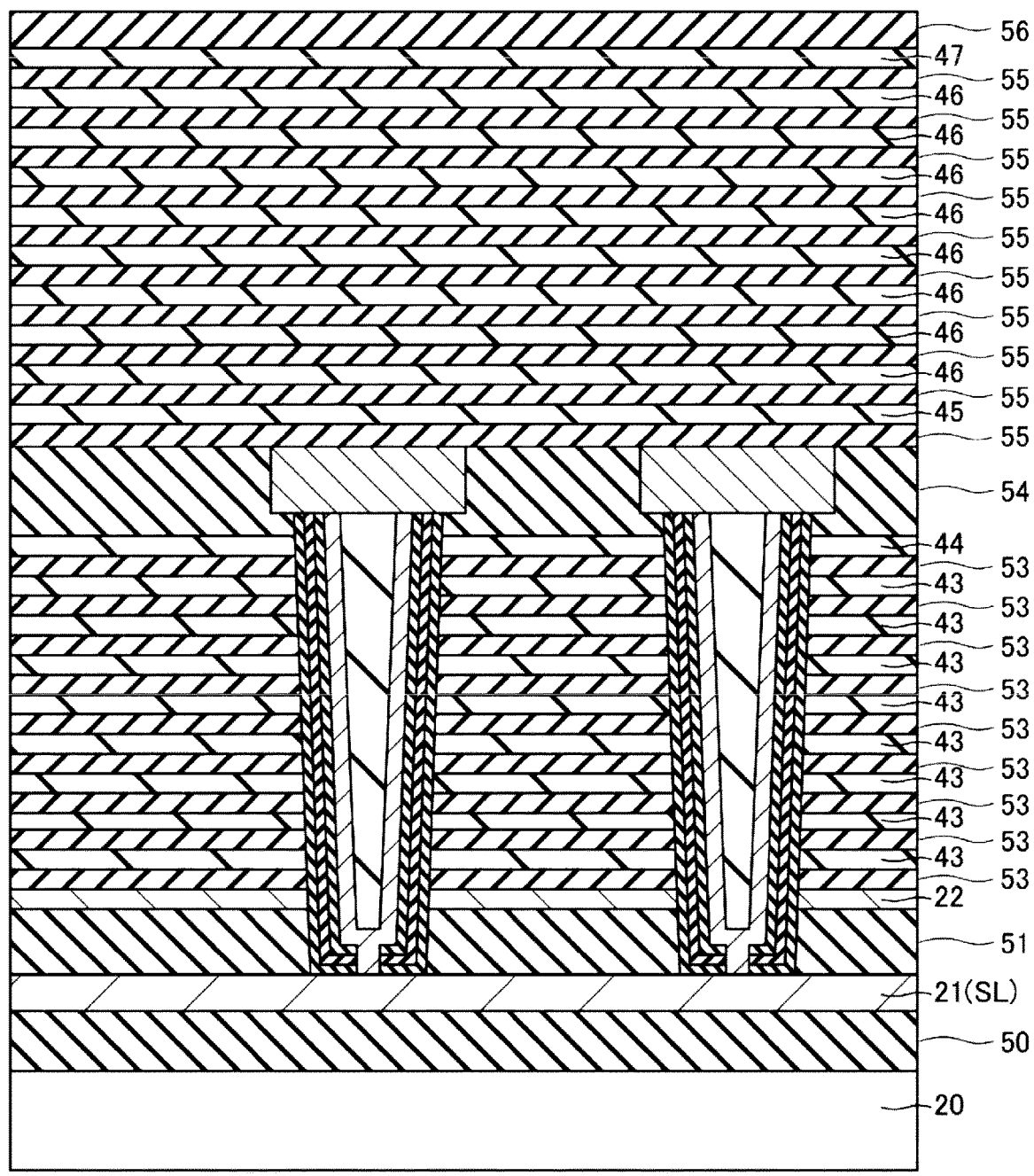
FIG. 12 is a sectional view of the memory cell array illustrating an example of a sectional structure of the semiconductor memory device according to the first embodiment in manufacturing steps.

Next, as illustrated in FIG. 12, sacrifice members 45 to 47 are stacked (step S106). The sacrifice members 45 to 47 are formed in regions in which the conductor layers 25, 26, and 27 respectively functioning as the dummy word line UDWL, the word line WL, and the select gate line SGD are to be formed. Specifically, first, an insulator layer 55 and a sacrifice member 45 are sequentially stacked on the insulator layer 54 and the sacrifice member 48. Thereafter, insulator layers 55 and sacrifice members 46 are alternately stacked on the sacrifice member 45, and a sacrifice member 47 is formed on the uppermost insulator layer 55. An insulator layer 56 is formed on the sacrifice member 47. For example, the number of layers in which the sacrifice members 46 are formed is equal to the number of the word lines WL stacked in the upper pillar UMP.

Each of the insulator layers 55 and 56 includes, for example, silicon oxide. The sacrifice members 45 to 47 include, for example, silicon nitride.

Figure 13:
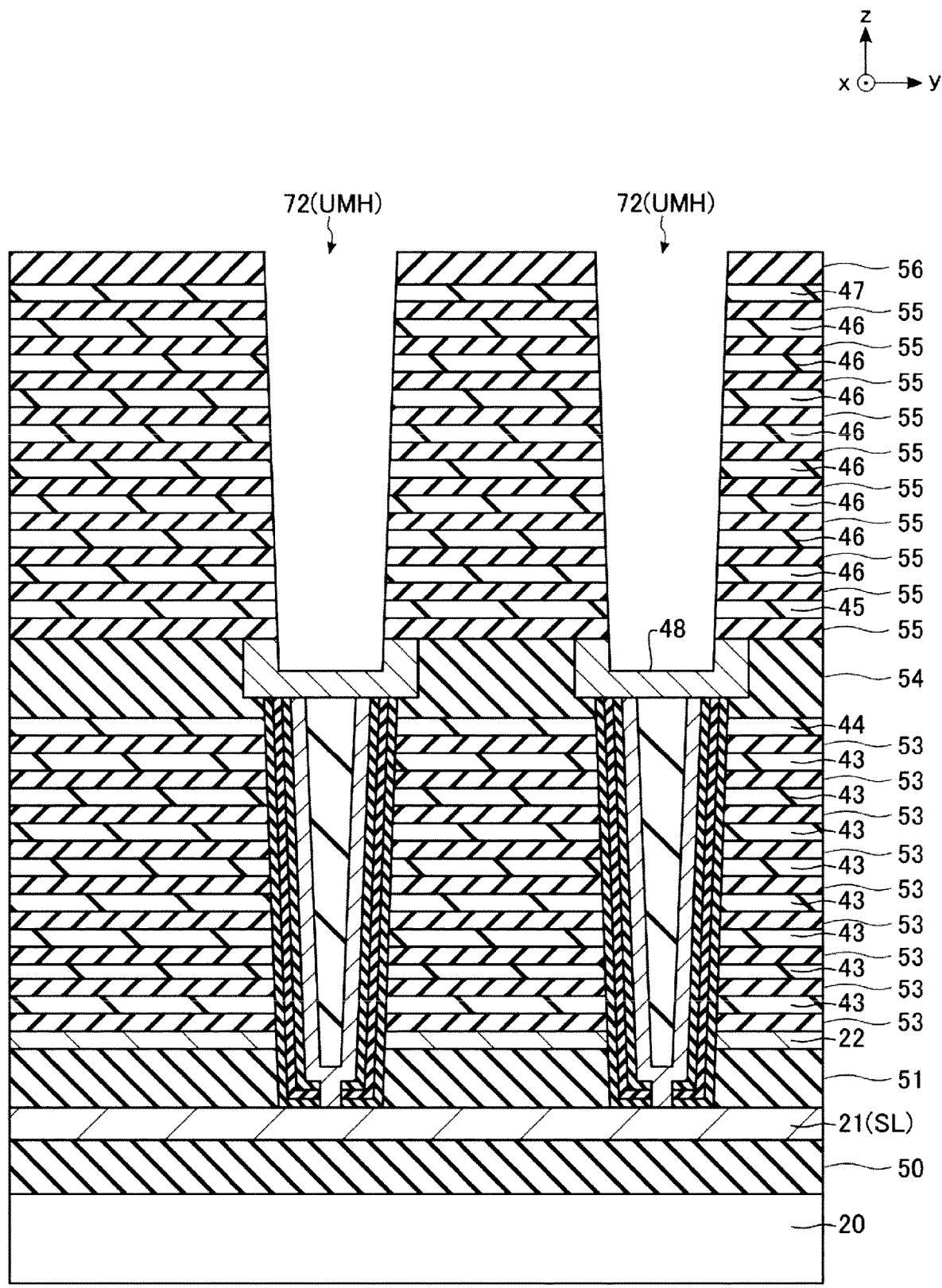
FIG. 13 is a sectional view of the memory cell array illustrating an example of a sectional structure of the semiconductor memory device according to the first embodiment in manufacturing steps.

Next, as illustrated in FIG. 13, an upper memory hole (UMH) 72 is formed (step S107). Specifically, first, by photolithography or the like, a mask which has an opening in a region in which the upper memory hole (UMH) 72 is to be formed is formed. Then, the upper memory hole (UMH) 72 is formed by anisotropic etching using the formed mask.

The upper memory hole (UMH) 72 penetrates each of the insulator layers 55 and 56 and the sacrifice members 45 to 47, and a bottom portion of the upper memory hole (UMH) 72 is stopped at, for example, the sacrifice member 48. The anisotropic etching in this step is, for example, RIE.

Figure 14:
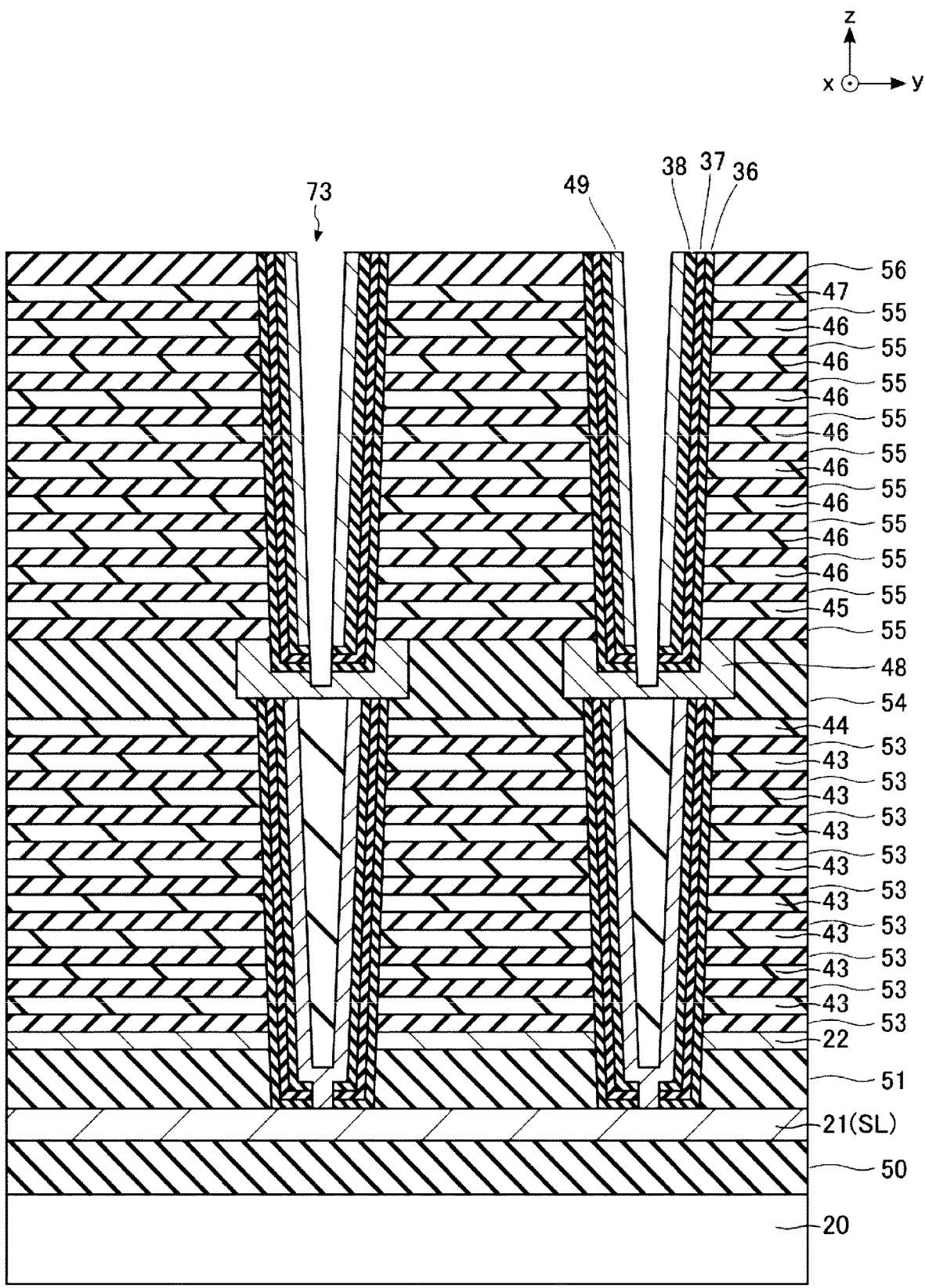
FIG. 14 is a sectional view of the memory cell array illustrating an example of a sectional structure of the semiconductor memory device according to the first embodiment in manufacturing steps.

Next, as illustrated in FIG. 14, a part of a stacked structure is formed in the upper memory hole (UMH) 72 (step S108). Specifically, a block insulating film 36, an insulating film 37, a tunnel insulating film 38, and a sacrifice member 49 are sequentially formed on a side surface and a bottom surface of the upper memory hole (UMH) 72. Then, the block insulating film 36, the insulating film 37, the tunnel insulating film 38, a part of the sacrifice member 49, and a part of the sacrifice member 48 at the bottom portion of the upper memory hole (UMH) 72 are partially removed. Thereby, a space 73 is formed in a region in which the upper pillar UMP and the joint portion JU are to be formed. The sacrifice member 49 includes silicon, for example, undoped silicon.

Figure 15:
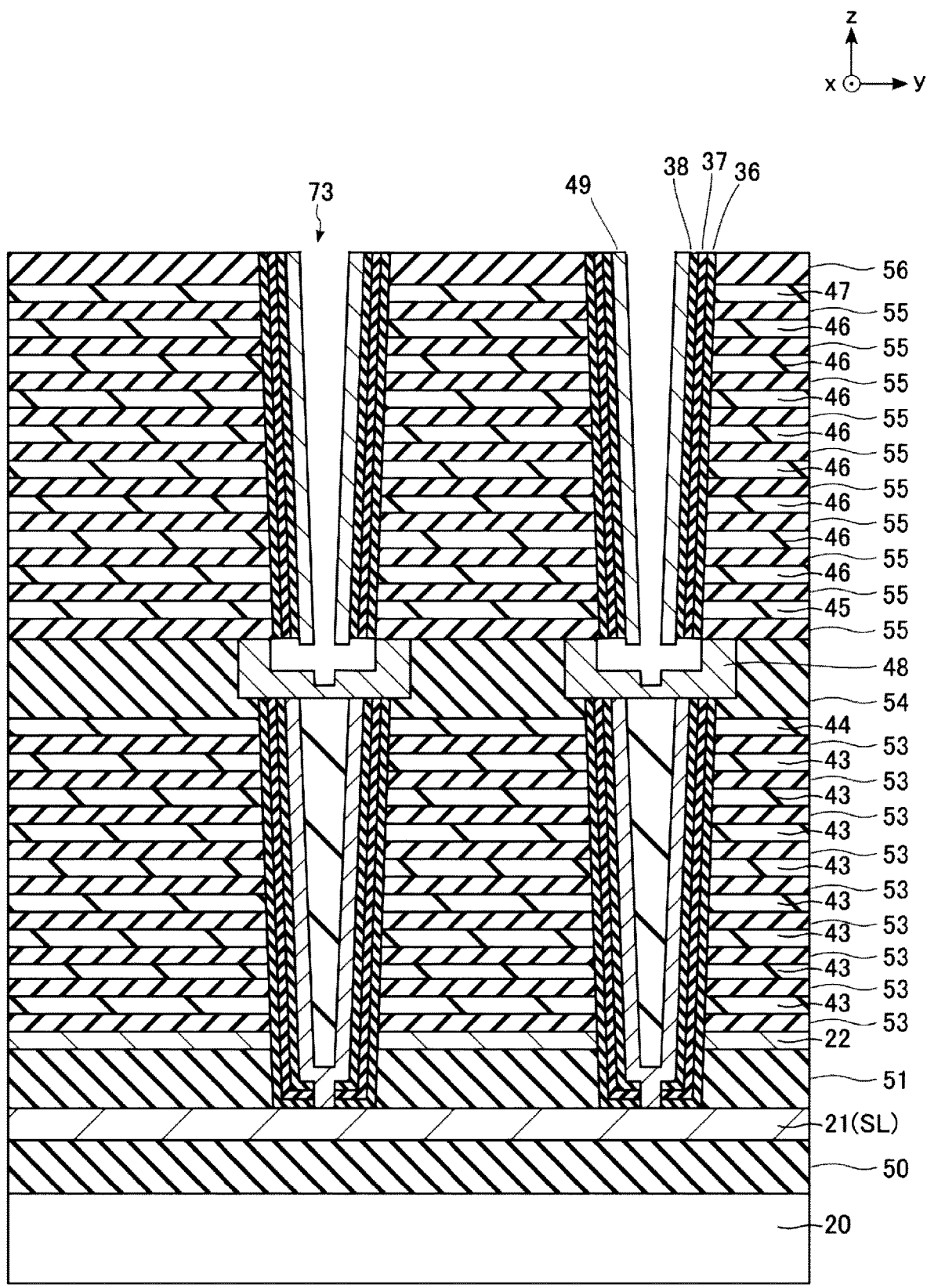
FIG. 15 is a sectional view of the memory cell array illustrating an example of a sectional structure of the semiconductor memory device according to the first embodiment in manufacturing steps.

Next, as illustrated in FIG. 15, portions of the block insulating film 36, the insulating film 37, and the tunnel insulating film 38 at the region in which the joint portion JU is to be formed are removed (step S109). Specifically, the block insulating film 36, the insulating film 37, and the tunnel insulating film 38 are etched from portions exposed in the space 73. Thereby, the portions of the block insulating film 36, the insulating film 37, and the tunnel insulating film 38 at the region in which the joint portion JU is to be formed are removed. In the etching in this step, for example, isotropic etching such as chemical dry etching (CDE) or wet etching may be applied. In particular, when CDE is applied, unevenness in etching due to a difference in materials (for example, oxide and nitride) of the block insulating film 36, the tunnel insulating film 38, and the insulating film 37 is prevented.

Figure 16:
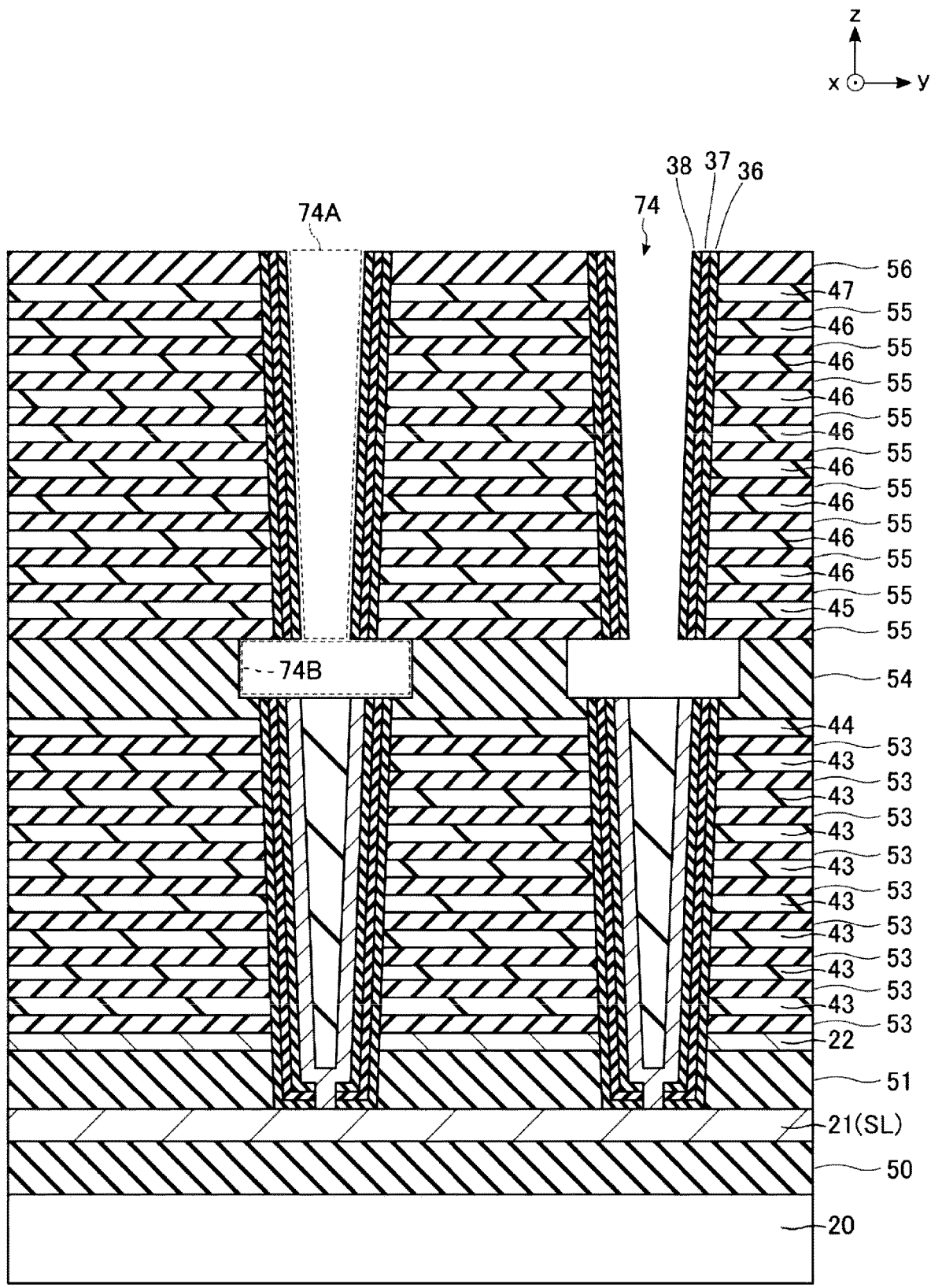
FIG. 16 is a sectional view of the memory cell array illustrating an example of a sectional structure of the semiconductor memory device according to the first embodiment in manufacturing steps.

Next, as illustrated in FIG. 16, the sacrifice members 48 and 49 are removed (step S110). Specifically, the sacrifice members 48 and 49 are etched and removed. Thereby, a space 74 is formed in the region in which the joint portion JU is to be formed and a part of the upper pillar UMP. The space 74 includes a space 74A in the upper pillar UMP and a space 74B in the region in which the joint portion JU is to be formed. In the space 74A, the tunnel insulating film 38 is exposed. In the space 74B, bottom surfaces of the block insulating film 36, the insulating film 37, and the tunnel insulating film 38 of the upper pillar UMP, and the insulator layer 54 are exposed, and upper surfaces of the block insulating film 36, the insulating film 37, the tunnel insulating film 38, the semiconductor layer 39, and the core member 34 of the lower pillar LMP are exposed.

Figure 17:
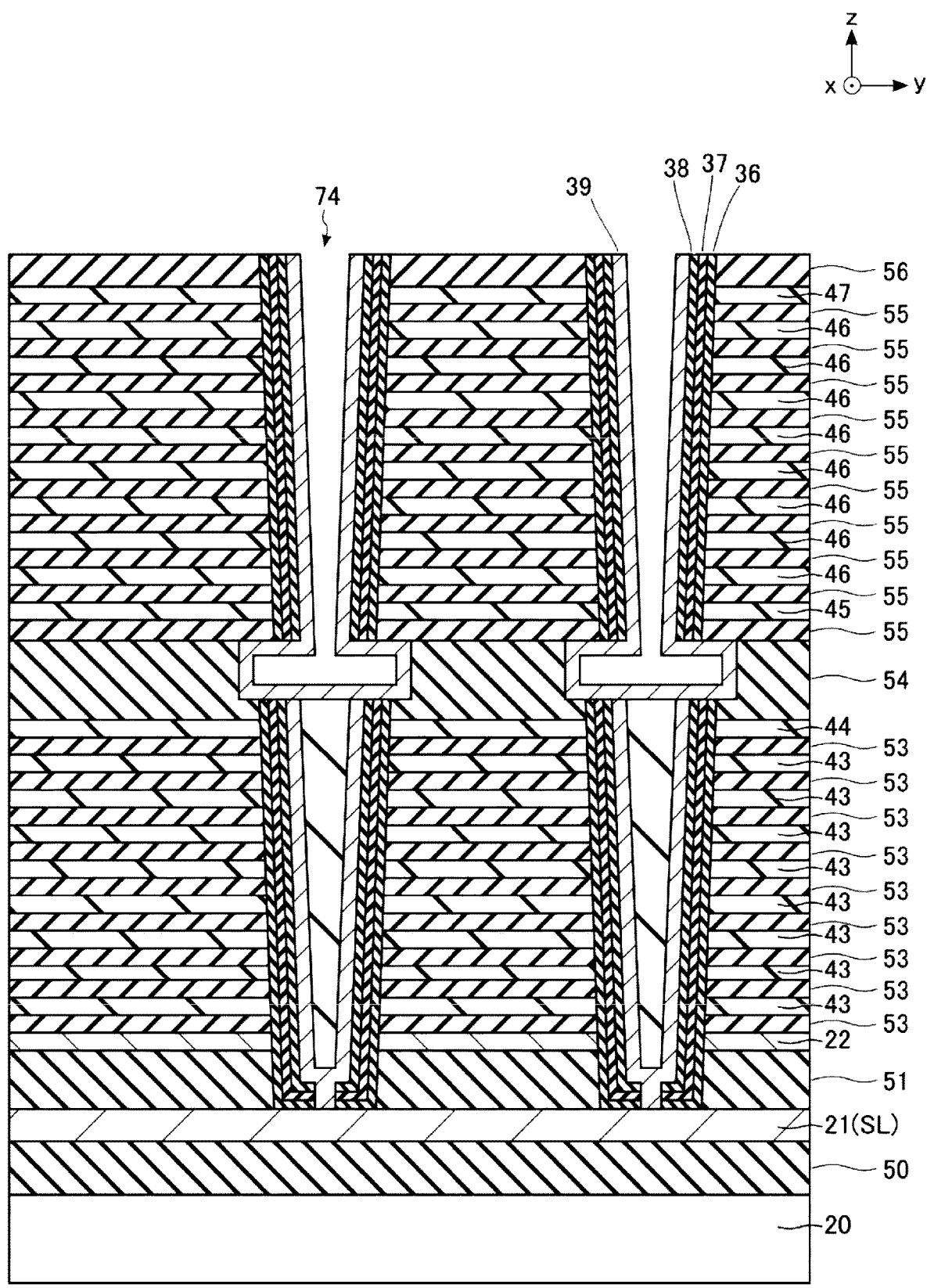
FIG. 17 is a sectional view of the memory cell array illustrating an example of a sectional structure of the semiconductor memory device according to the first embodiment in manufacturing steps.

Next, as illustrated in FIG. 17, a semiconductor layer 39 is formed (step S111). Specifically, the semiconductor layer 39 is formed on front surfaces of the exposed portions in the space 74 formed in step S110. More specifically, the semiconductor layer 39 is formed as follows. That is, the semiconductor layer 39 is formed on a front surface of the tunnel insulating film 38 in the upper pillar UMP. Further, in the region in which the joint portion JU is to be formed, the semiconductor layer 39 is formed across a region on the bottom surfaces of the block insulating film 36, the insulating film 37, and the tunnel insulating film 38 of the upper pillar UMP, a part of a region on the bottom surface of the lowermost insulator layer 55, and a region on a side surface of the insulator layer 54. Further, the bottom surface of the semiconductor layer 39 is in contact with, for example, upper surfaces of the block insulating film 30, the insulating film 31, the tunnel insulating film 32, the semiconductor layer 33, and the core member 34 of the lower pillar LMP. The bottom surface of the semiconductor layer 39 contacts with at least the upper surface of the semiconductor layer 33 of the lower pillar LMP. For example, the semiconductor layer 39 in the joint portion JU and the upper pillar UMP may be formed as a continuous film, or may have a substantially uniform film thickness. Even when the semiconductor layer 39 is formed, a part of the space 74 is not filled with the semiconductor layer 39, and remains as the space 74.

Figure 18:
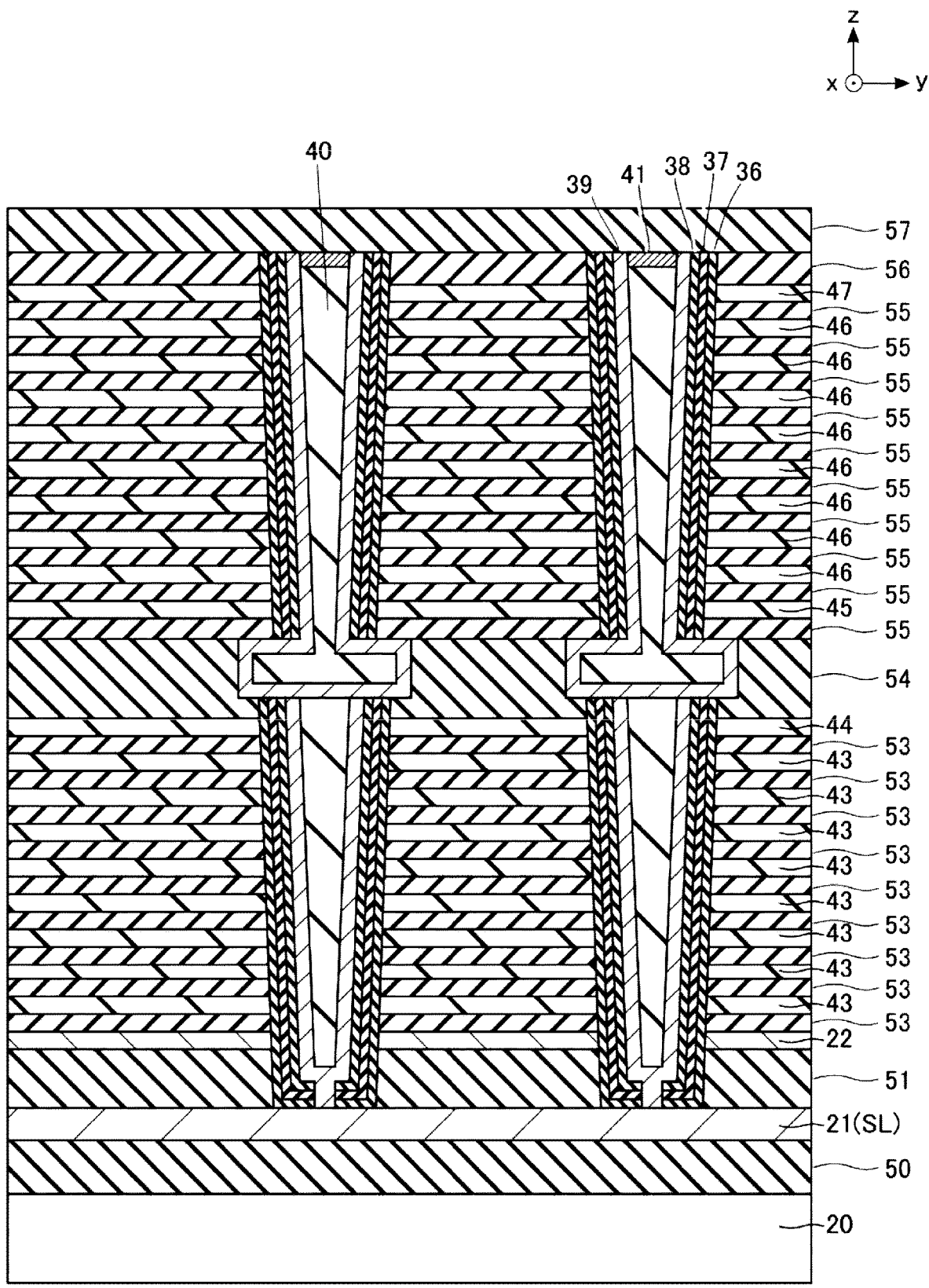
FIG. 18 is a sectional view of the memory cell array illustrating an example of a sectional structure of the semiconductor memory device according to the first embodiment in manufacturing steps.

Next, as illustrated in FIG. 18, the joint portion JU and the upper pillar UMP are formed (step S112). Specifically, the space 74 is filled with a core member 40. Then, a part of the core member 40 formed in an upper portion of the space 74 is removed, and a semiconductor layer 41 is formed in the space. Thereby, the upper pillar UMP is formed. Thereafter, an insulator layer 57 is formed on the insulator layer 56 and the upper pillar UMP.

Figure 19:
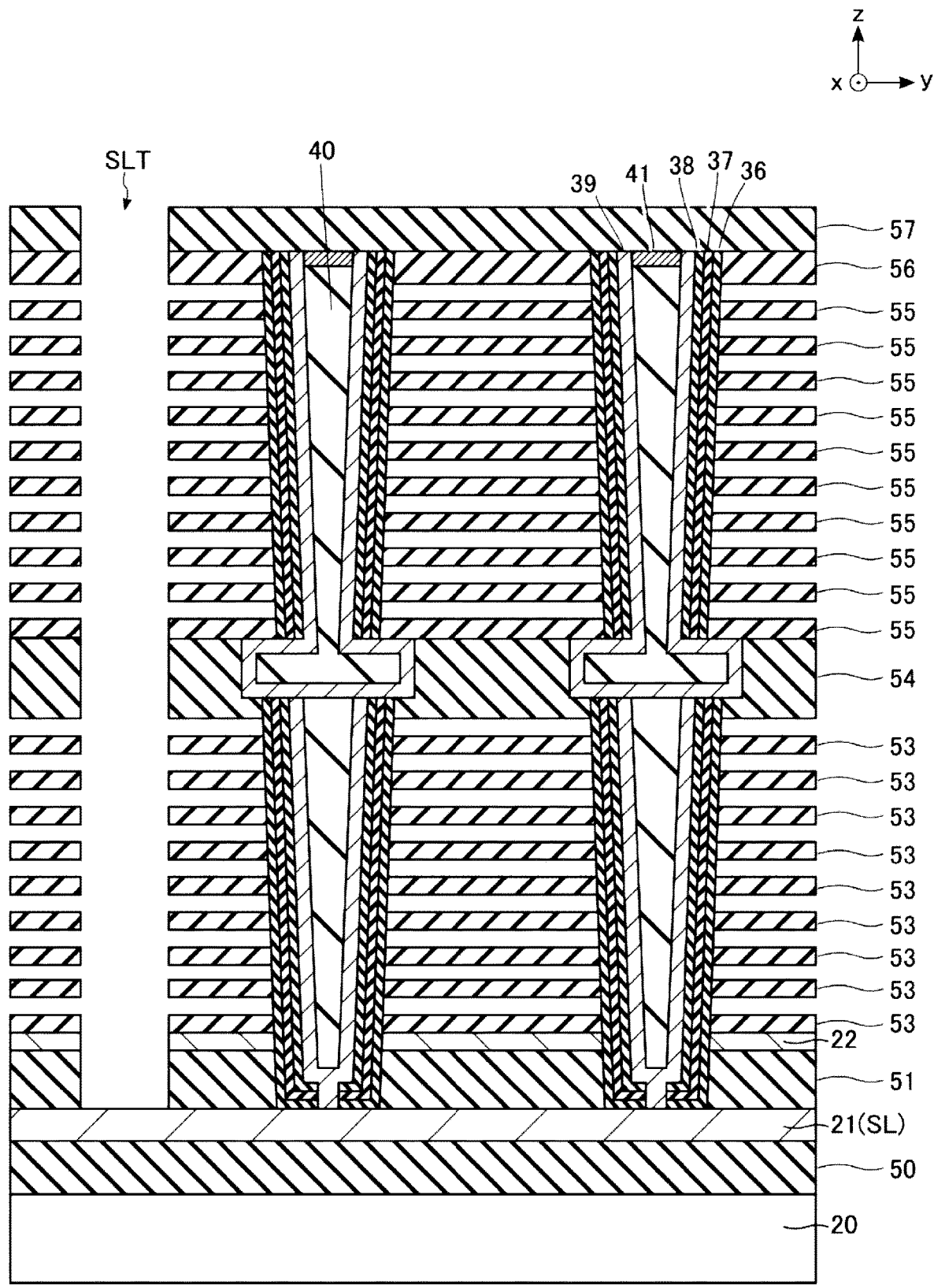
FIG. 19 is a sectional view of the memory cell array illustrating an example of a sectional structure of the semiconductor memory device according to the first embodiment in manufacturing steps.

Next, as illustrated in FIG. 19, the sacrifice members 43 to 47 are removed (step S113). Specifically, first, by photolithography or the like, a mask which has an opening in a region in which a slit SLT is to be formed is formed. Then, a slit SLT is formed by anisotropic etching using the formed mask.

The slit SLT formed in this step slits each of the insulator layers 51 and 53 to 57, the sacrifice members 43 to 47, and the conductor layer 22, and a bottom portion of the slit SLT ends at, for example, the conductor layer 21. The bottom portion of the slit SLT may reach at least the conductor layer 21. The anisotropic etching in this step is, for example, RIE.

Next, the sacrifice members 43 to 47 are removed. First, a front surface of the conductor layer 21 exposed in the slit SLT is oxidized, and thus an oxidized protective film (not illustrated) is formed. Thereafter, the sacrifice members 43 to 47 are selectively removed by, for example, wet etching using heat phosphoric acid. The three-dimensional structure from which the sacrifice members 43 to 47 are removed is maintained by the plurality of memory pillars MP and the like. By removing the sacrifice members 43 to 47, spaces are formed in regions in which the sacrifice members 43 to 47 are formed.

Figure 20:
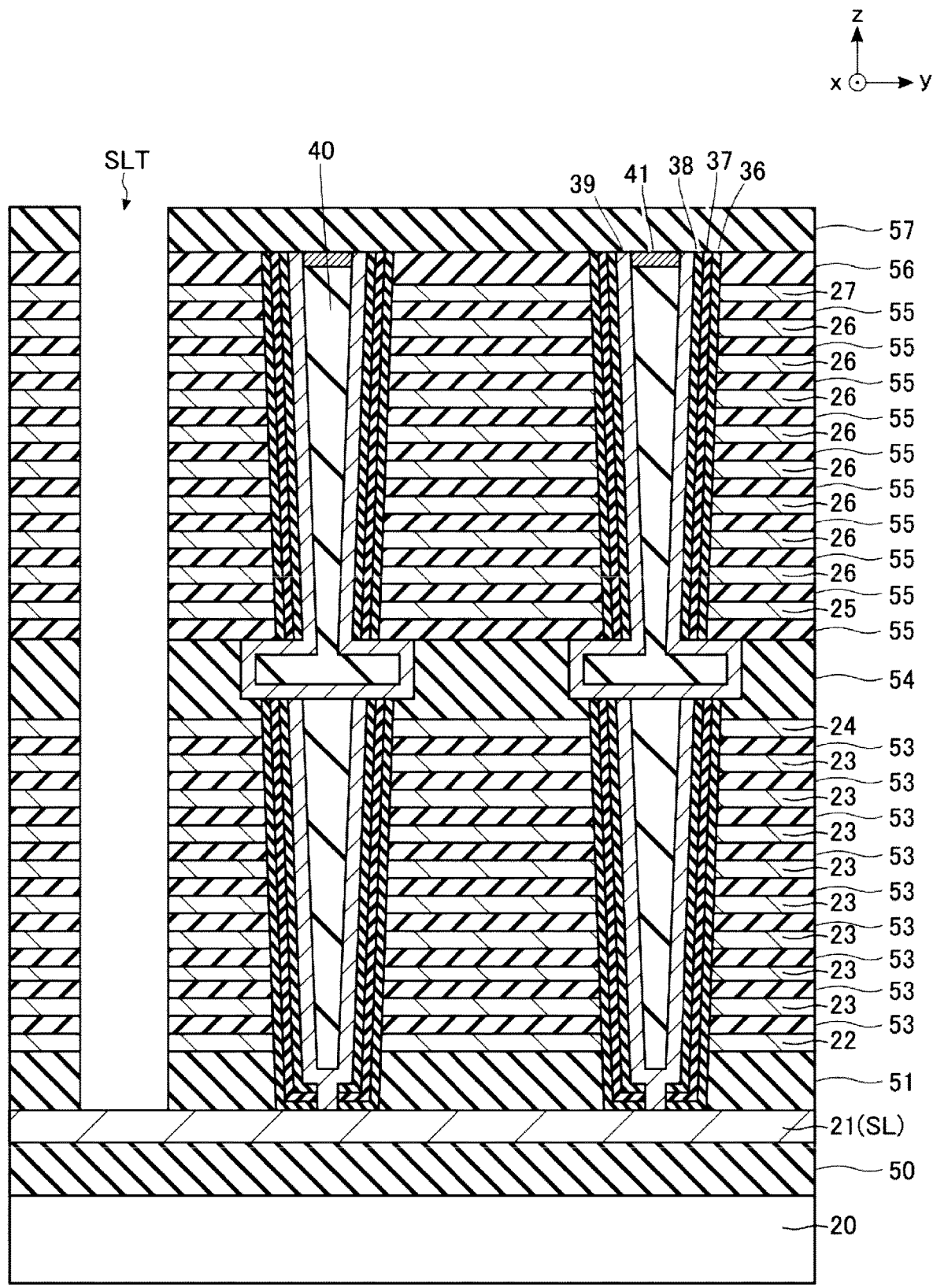
FIG. 20 is a sectional view of the memory cell array illustrating an example of a sectional structure of the semiconductor memory device according to the first embodiment in manufacturing steps.

Next, as illustrated in FIG. 20, the spaces formed in step S113 are filled with conductor layers 23 to 27 (step S114). For example, the conductor layers 23 to 27 grow from portions exposed through the slit SLT, such as a side surface of the memory pillar MP. Then, the conductor layers 23 to 27 formed in the slit SLT are removed. Thereby, the plurality of conductor layers 23 functioning as the word lines WL0 to WL7, the conductor layer 24 functioning as the dummy word line LDWL, the conductor layer 25 functioning as the dummy word line UDWL, the plurality of conductor layers 26 functioning as the word lines WL8 to WL15, and the conductor layer 27 functioning as the select gate line SGD are formed. The conductor layers 23 to 27 formed in this step may include a barrier metal. In this case, in the formation of the conductor layers after the removal of the sacrifice members 43 to 47, for example, as a barrier metal, titanium nitride is formed and then tungsten is formed. Thereafter, an insulator is formed in the slit SLT.

Next, the insulator layer 57 on the memory pillar MP is removed, and a contact MPC is provided on the memory pillar MP. Next, a conductor layer 28 functioning as the bit line BL is formed on the contact MPC.

As described above, by the manufacturing process of the semiconductor memory device 1 according to the first embodiment, the memory pillar MP, the source line SL, the word lines WL, the select gate lines SGS and SGD, and the dummy word lines LDWL and UDWL, which are connected to the memory pillar MP, are formed. The above-described manufacturing process is merely an example, as other processing may be inserted in the manufacturing process, and the order in the manufacturing process may be changed without affecting the structure.

1-3. Advantage (Effect) According to First Embodiment

According to the semiconductor memory device 1 of the first embodiment, it is possible to prevent deterioration in electrical characteristics of the joint portion JU and improve reliability of data. Hereinafter, detailed effects of the semiconductor memory device 1 according to the first embodiment will be described.

In a semiconductor memory device in which memory cell transistors are stacked with a three-dimensional structure, in order to increase density of the memory cell transistors, a method of forming memory pillars by connecting a plurality of pillars to a substrate in a vertical direction is known. With memory pillars formed by connecting the plurality of pillars, a joint portion may be provided between the connected pillars. This joint portion reduces the difficulty in process of the semiconductor memory device, preventing defects due to misalignment between the connected pillars.

Figure 21:
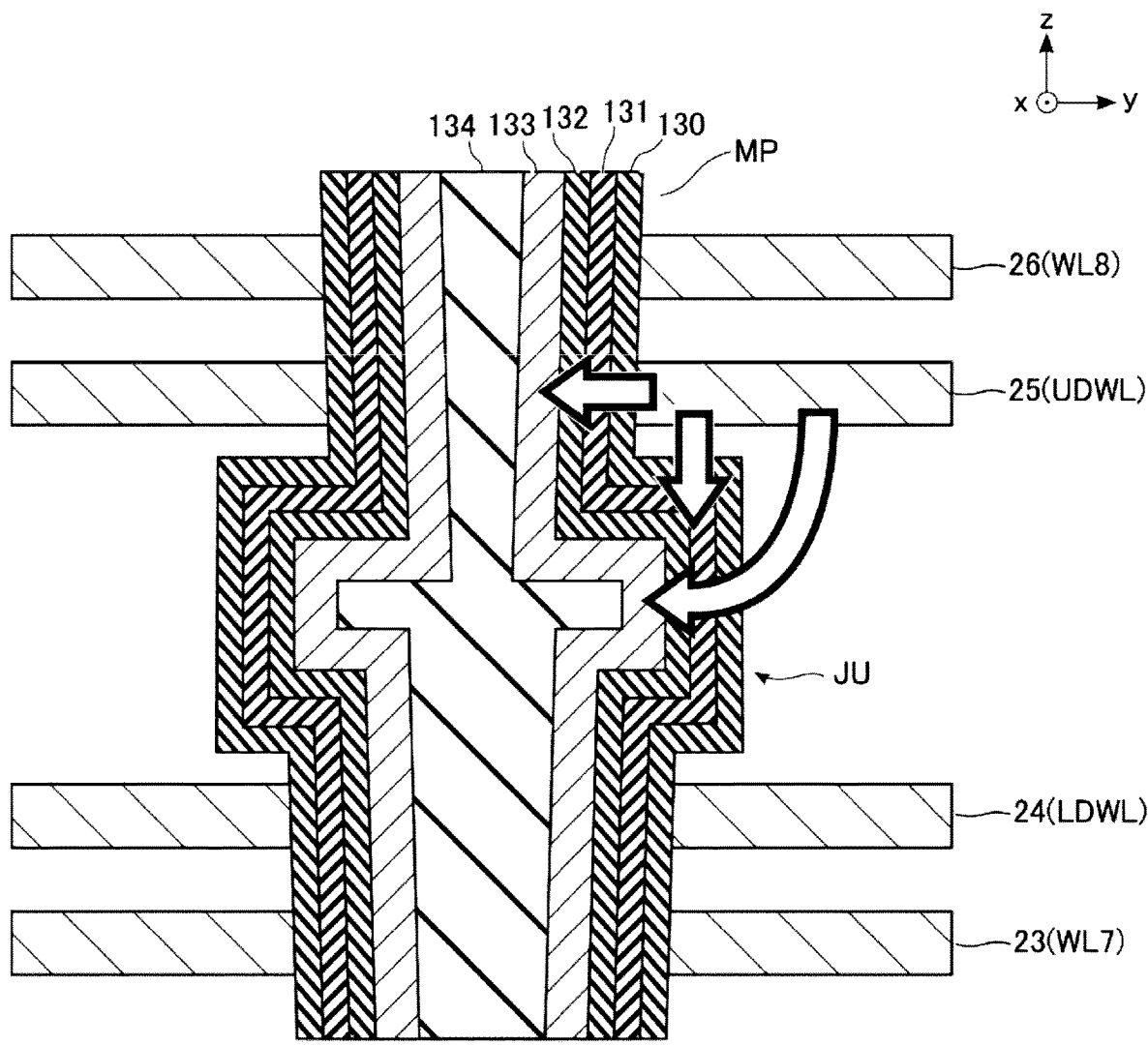
FIG. 21 is a sectional view illustrating an example of a sectional structure of the memory cell array in the semiconductor memory device according to a comparative example of the first embodiment.

On the other hand, the electrical characteristics of the joint portion may be different from the electrical characteristics of the other regions of the memory pillar, and the electrical characteristics of the memory pillar may deteriorate at the joint portion. This case will be described with reference to FIG. 21. FIG. 21 is an example of a sectional structure of the memory cell array 10 according to a comparative example of the first embodiment.

In the memory pillar MP including the joint portion JU, a thickness of the region in which the joint portion JU is formed, that is, a thickness between the conductor layers 24 and 25 is thicker than a layer thickness between the other word lines WL. Therefore, a gap between the wirings (conductor layers 24 and 25) adjacent to the joint portion JU and the channel (semiconductor layer 39) in the joint portion JU becomes wider.

Further, a block insulating film 130, an insulating film 131, a tunnel insulating film 132, a semiconductor layer 133, and a core member 134 are connected in the lower pillar LMP and the upper pillar UMP. Thus, in the joint portion JU, the block insulating film 130, the insulating film 131, and the tunnel insulating film 132 are provided between the semiconductor layer 133 and the conductor layers 24 and 25. Therefore, the gap between the wirings adjacent to the joint portion JU and the channel in the joint portion JU may become further wider.

As a result, as indicated by arrows of FIG. 21, in the semiconductor memory device 1 according to the comparative example, the semiconductor layer 133 in the joint portion JU is less likely to receive an electric field by a voltage applied to the conductor layers 24 and 25. Therefore, the voltage applied to the semiconductor layer 133 in the joint portion JU (between the conductor layers 24 and 25) is relatively lower than the voltage applied to the semiconductor layer 133 between the other word lines WL. In this case, resistance of the channel of the semiconductor layer 133 may increase.

Figure 22:
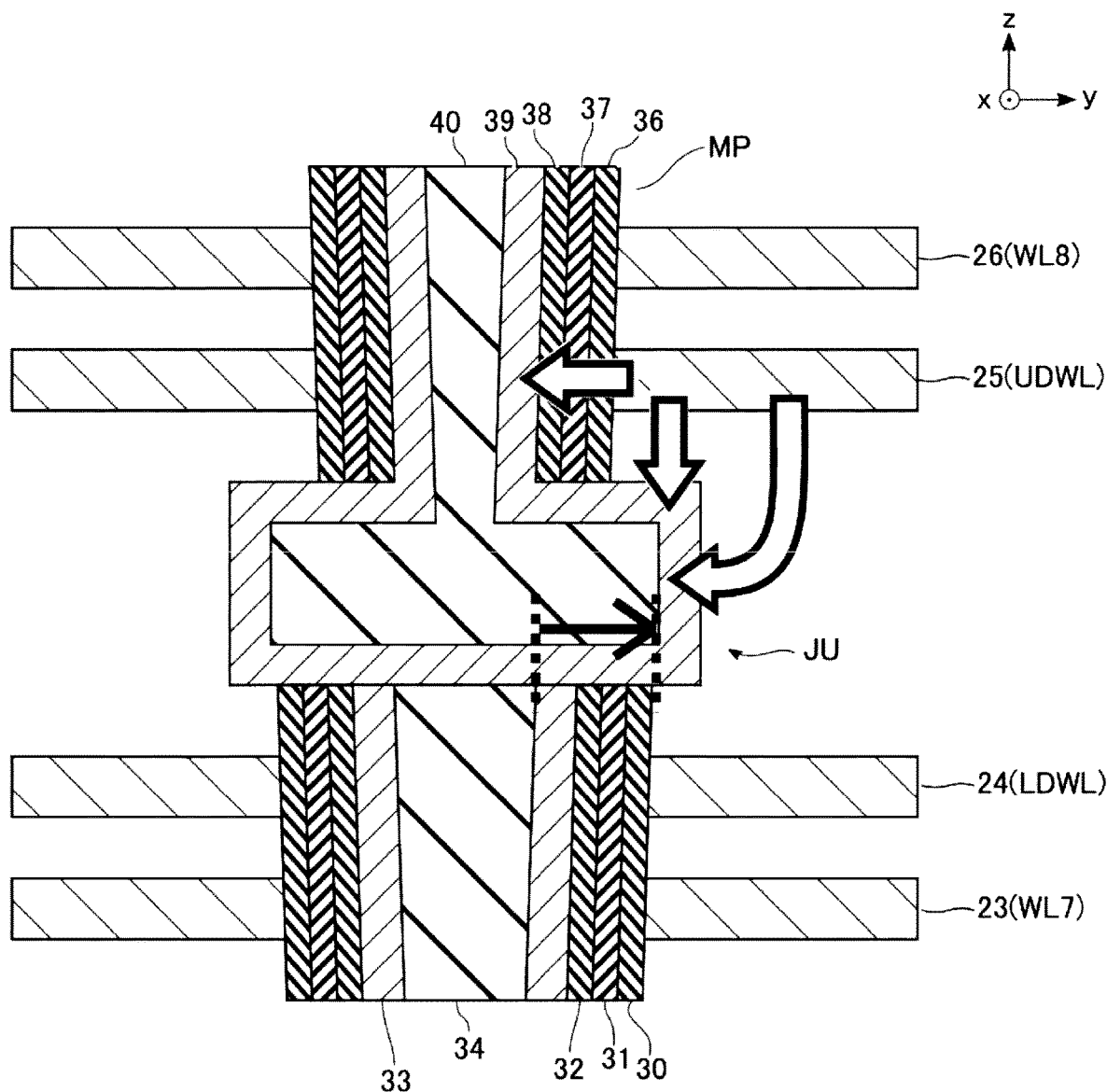
FIG. 22 is a sectional view of the memory cell array illustrating an example of electric fields in FIG. 5.

On the other hand, in the semiconductor memory device 1 according to the first embodiment, as illustrated in FIG. 22, in the joint portion JU, the block insulating film, the insulating film, and the tunnel insulating film are not provided, and the semiconductor layer 39 protrudes toward the outer circumference of the memory pillar by at least thicknesses of the block insulating film, the insulating film, and the tunnel insulating film. That is, the semiconductor memory device 1 according to the first embodiment has a structure in which the conductor layers 24 and 25 adjacent to the joint portion JU are closer to the semiconductor layer 39 in the joint portion JU than in the semiconductor memory device 1 according to the comparative example.

Thereby, as indicated by arrows of FIG. 22, in the semiconductor memory device 1 according to the first embodiment, the semiconductor layer 39 in the joint portion JU is likely to receive an electric field by a voltage applied to the conductor layers 24 and 25. Thus, in the joint portion JU, the voltage applied from the conductor layers 24 and 25 to the semiconductor layer 39 can be increased. In other words, in the semiconductor memory device 1 according to the first embodiment, a voltage is likely to be applied to the semiconductor layer 39 in the joint portion JU than in the semiconductor memory device 1 according to the comparative example. Therefore, since a voltage is applied to the conductor layers 24 and 25, a channel is likely to be formed in the semiconductor layer 39 in the joint portion JU.

In the following, in the semiconductor memory device 1 according to the first embodiment, an effect obtained by removing the sacrifice member 48 will be described. As described above, the sacrifice member 48 illustrated in FIG. 15 and the like includes, for example, silicon. After removing the sacrifice member 48 in the step of FIG. 16, the semiconductor layer 39 including silicon is formed again in the step of FIG. 17. Even though the sacrifice member 48 and the semiconductor layer 39 include the same material, the sacrifice member 48 is removed. This is because the silicon of the sacrifice member 48 may be changed by the etching illustrated in FIG. 13 when forming the upper memory hole (UMH) 72. The change of the silicon is considered due to, for example, a high defect density or an excessive amount of impurities. The changed silicon may cause hindrance of a channel current and deterioration in electrical characteristics of the joint portion JU. Therefore, in the semiconductor memory device 1 according to the first embodiment, the sacrifice member 48 is removed before forming the semiconductor layer 39, and thus deterioration in electrical characteristics of the joint portion JU can be prevented.

As a result, the semiconductor memory device 1 according to the first embodiment can prevent the channel current of the joint portion JU from being decreased. Therefore, the semiconductor memory device 1 according to the first embodiment can have higher performance than the semiconductor memory device 1 according to the comparative example.

2. Second Embodiment

In a second embodiment, the memory pillar MP includes two joint portions, and has a structure in which pillars are stacked in three stages in the z direction. In the second embodiment, the memory pillar MP has a structure in which pillars are further connected on the upper pillar UMP according to the first embodiment through joint portions, and other structures are substantially the same as the structures according to the first embodiment. In the following, the semiconductor memory device 1 according to the second embodiment will be described focusing on differences from the first embodiment.

In the second embodiment, each NAND string includes 24 memory cell transistors MT0 to MT23, and further includes dummy transistors LDT2 and UDT2. The circuit configuration of the memory cell array 10 according to the second embodiment is similar to the circuit configuration according to the first embodiment illustrated in FIG. 2, although there is a difference from the circuit configuration illustrated in FIG. 2. Hereinafter, an outline will be described.

The memory cell transistors MT16 to MT23 are connected in series. Each NAND string NS includes, between the memory cell transistor MT15 and the select transistor ST1, a set of a dummy transistor LDT2, a dummy transistor UDT2, and memory cell transistors MT16 to MT23, which are connected in series. That is, a drain of the memory cell transistor MT15 is connected to a source of the dummy transistor LDT2. A drain of the dummy transistor LDT2 is connected to a source of the dummy transistor UDT2. A drain of the dummy transistor UDT2 is connected to a source of the memory cell transistor MT16. A drain of the memory cell transistor MT23 is connected to a source of the select transistor ST1.

Similar to the memory cell transistors MT0 to MT15, in the same block BLK, control gates of the memory cell transistors MT16 to MT23 are commonly connected to each of the word lines WL16 to WL23. Control gates of the dummy transistors LDT2 are commonly connected to a dummy word line LDWL2. Control gates of the dummy transistors UDT2 are commonly connected to a dummy word line UDWL2.

Figure 23:
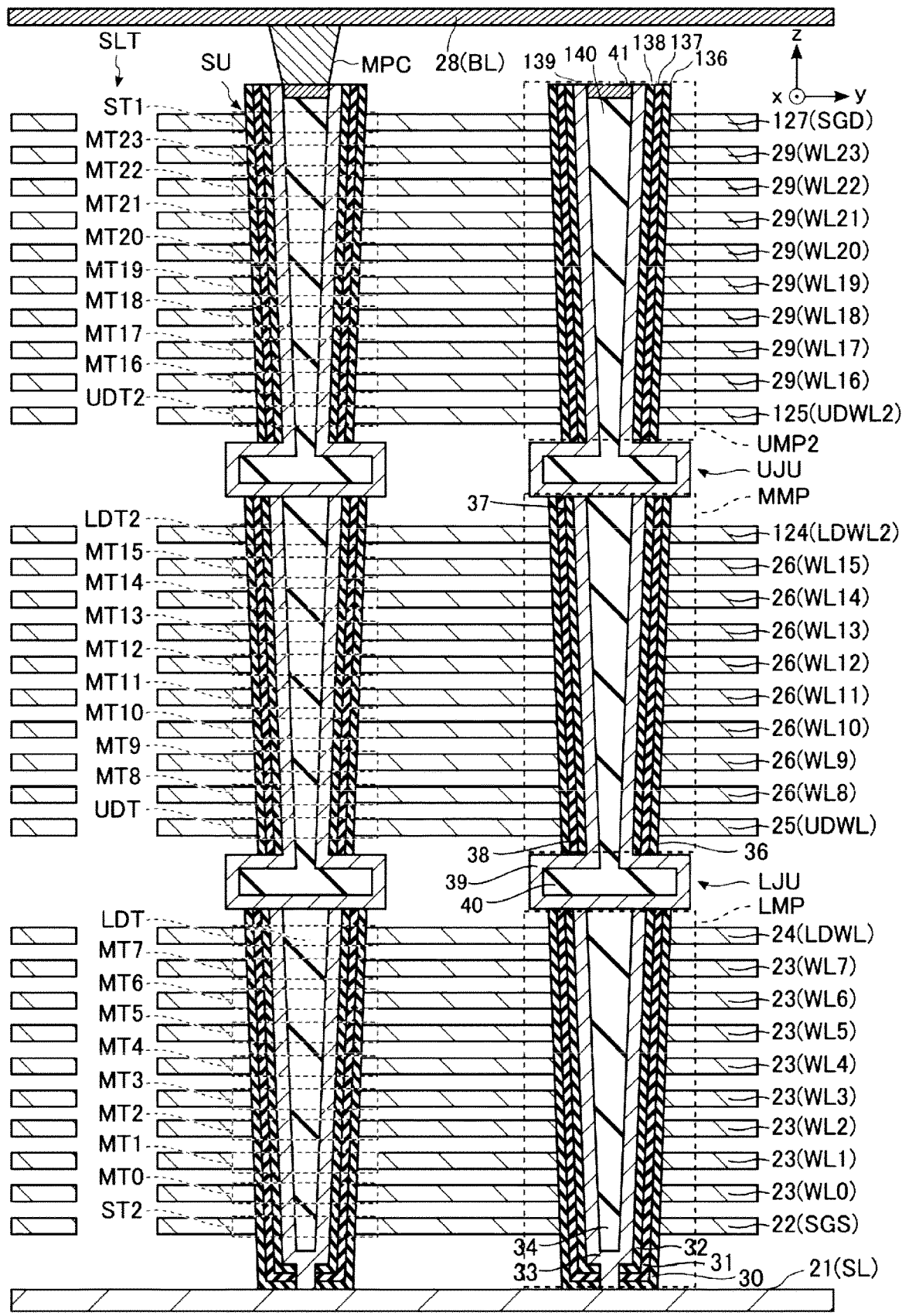
FIG. 23 is a sectional view illustrating an example of a sectional structure of the memory cell array in the semiconductor memory device according to a second embodiment.

The second embodiment will be described with reference to FIG. 23. FIG. 23 illustrates an example of a sectional structure of the memory cell array 10 in the semiconductor memory device 1 according to the second embodiment. FIG. 23 illustrates the same portion as FIG. 4 of the first embodiment. In the following, differences from the explanation described with reference to FIG. 4 will be mainly described.

In the second embodiment, the memory pillar MP has a structure in which pillars are further connected on the upper pillar UMP according to the first embodiment through joint portions. Here, in order to distinguish from the description in the first embodiment, in the second embodiment, a joint portion joined to an upper portion of the lower pillar LMP may be referred to as a lower joint portion LJU, a pillar joined to an upper portion of the lower joint portion LJU may be referred to as a middle pillar MMP, a joint portion joined to an upper portion of the middle pillar MMP may be referred to as an upper joint portion UJU, and a pillar joined to an upper portion of the upper joint portion UJU may be referred to as an upper pillar UMP2. In this case, the portions referred to as the lower joint portion LJU and the middle pillar MMP in the second embodiment respectively correspond to the portions referred to as the joint portion JU and the upper pillar UMP in the first embodiment.

For this reason, in the second embodiment, descriptions of the lower pillar LMP, the lower joint portion LJU, and the middle pillar MMP will be omitted except for differences from the first embodiment, and the upper joint portion UJU and the upper pillar UMP2 will be mainly described.

As illustrated in FIG. 23, the memory cell array 10 further includes, for example, conductor layers 29, 125, and 127. The portion referred to as the conductor layer 24 in the first embodiment may be referred to as the conductor layer 124 in the second embodiment in order to distinguish the second embodiment from the first embodiment. The conductor layer 124 is used as the dummy word line LDWL2. In FIG. 23, for easy understanding of the drawing, insulator layers may be omitted.

A conductor layer 125 is provided above the conductor layer 124 with an insulator layer interposed therebetween. The conductor layer 125 is formed, for example, in a plate shape spreading along the xy plane, and is used as the dummy word line UDWL2. The conductor layer 125 includes, for example, tungsten.

Insulator layers and conductor layers 29 are alternately stacked above the conductor layer 125. The conductor layer 29 is formed, for example, in a plate shape spreading along the xy plane. For example, a plurality of the stacked conductor layers 29 are used as the word lines WL16 to WL23 in order from the semiconductor substrate 20 side. The conductor layer 29 includes, for example, tungsten.

A conductor layer 127 is provided above the uppermost conductor layer 29 with an insulator layer interposed therebetween. The conductor layer 127 is formed, for example, in a plate shape spreading along the xy plane, and is used as the select gate line SGD. The conductor layer 127 includes, for example, tungsten.

A conductor layer 28 is provided above the conductor layer 127 with an insulator layer interposed therebetween.

Each of the plurality of memory pillars MP extends along the z direction, and penetrates the conductor layers 22 to 26, 29, 124, 125, and 127.

First, in the middle pillar MMP, a difference from the first embodiment is that the semiconductor layer 41 is provided on an upper portion of the upper pillar UMP2 without providing on the middle pillar MMP.

The upper pillar UMP2 has a structure similar to the structure of the middle pillar MMP, and includes, for example, a block insulating film 136, an insulating film 137, a tunnel insulating film 138, a semiconductor layer 139, a core member 140, and a semiconductor layer 41. The upper joint portion UJU has a structure similar to the structure of the lower joint portion LJU, and includes, for example, a semiconductor layer 139 and a core member 140.

Specifically, the core member 140 includes a portion of the upper pillar UMP2 and a portion of the upper joint portion UJU. The portion of the core member 140 in the upper pillar UMP2 extends along the Z direction, and is provided at the center portion of the upper pillar UMP2. An upper end of the portion of the core member 140 in the upper pillar UMP2 is disposed in a layer above the layer in which the conductor layer 127 is provided.

The portion of the core member 140 in the upper joint portion UJU is provided at the center portion of the upper joint portion UJU. The portion of the core member 140 in the upper joint portion UJU is disposed in, for example, a layer provided between the conductor layers 124 and 125. The portion of the core member 140 in the upper joint portion UJU is thicker than the portion of the core member 140 in the upper pillar UMP2. Details are the same as the lower joint portion LJU described with reference to FIG. 5. The core member 140 includes an insulator such as silicon oxide, and includes, for example, substantially the same material as the core member 34.

The semiconductor layer 139 covers the periphery of the core member 140 in, for example, the upper pillar UMP2 and the upper joint portion UJU. That is, the semiconductor layer 139 covers side surfaces of the core member 140 in the upper pillar UMP2, and covers, in the upper joint portion UJU, an upper surface, side surfaces, and a bottom surface of the portion of the core member 140 in the upper joint portion UJU. For example, in the upper pillar UMP2 and the upper joint portion UJU, the semiconductor layer 139 is continuously provided to have approximately the same thickness. The semiconductor layer 139 may have approximately the same thickness as, for example, the thickness of the semiconductor layers 33 and 39. A bottom surface of the semiconductor layer 139 is disposed in a layer provided between, for example, the conductor layers 124 and 125. Further, the bottom surface of the semiconductor layer 139 is in contact with, for example, upper surfaces of the block insulating film 36, the insulating film 37, the tunnel insulating film 38, the semiconductor layer 39, and the core member 40 of the middle pillar MMP. The semiconductor layer 139 and the semiconductor layer 39 are electrically connected to each other. The semiconductor layer 139 includes silicon, for example, undoped silicon. The semiconductor layer 139 includes, for example, substantially the same material as the semiconductor layers 33 and 39.

The tunnel insulating film 138 covers a side surface of the semiconductor layer 139 in the upper pillar UMP2. The tunnel insulating film 138 includes, for example, silicon oxide, and includes, for example, substantially the same material as the tunnel insulating films 32 and 38. The insulating film 137 covers a side surface of the tunnel insulating film 138. The insulating film 137 includes, for example, silicon nitride, and includes, for example, substantially the same material as the insulating films 31 and 37. The block insulating film 136 covers a side surface of the insulating film 137. The block insulating film 136 includes, for example, silicon oxide, and includes, for example, substantially the same material as the block insulating films 30 and 36. The semiconductor layer 41 is disposed in a layer above the conductor layer 127. A side surface of the semiconductor layer 41 is in contact with, for example, an inner wall of the semiconductor layer 139, and a bottom surface of the semiconductor layer 41 is in contact with, for example, an upper surface of the core member 140. The semiconductor layer 41 and the semiconductor layer 139 are electrically connected to each other. The semiconductor layer 41 includes, for example, the same material as the semiconductor layers 33, 39, and 139.

The contact MPC, having a columnar shape, is provided on upper surfaces of the semiconductor layers 139 and 41 in the memory pillar MP. One conductor layer 28, that is, one bit line BL is in contact with an upper surface of the contact MPC.

In the above-described structure of the memory pillar MP, a portion in which the memory pillar MP intersects with the conductor layer 29 functions as the memory cell transistor MT. A portion in which the memory pillar MP intersects with the conductor layer 124 functions as the dummy transistor LDT2. A portion in which the memory pillar MP intersects with the conductor layer 125 functions as the dummy transistor UDT2. A portion in which the memory pillar MP intersects with the conductor layer 127 functions as the select transistor ST1.

That is, the semiconductor layers 33, 39, and 139 are used as a channel of each of the memory cell transistors MT, the select transistors ST1 and ST2, and the dummy transistors LDT2 and UDT2. The insulating films 31, 37, and 137 are used as a charge storage layer of the memory cell transistor MT. Thereby, each of the memory pillars MP can function as one NAND string NS.

As illustrated in FIG. 23, each of the dummy transistor UDT2, the memory cell transistors MT16 to MT23, and the select transistor ST1 is formed in the upper pillar UMP2.

According to the second embodiment, the lower joint portion LJU and the upper joint portion UJU have the same structure as the joint portion JU according to the first embodiment. Therefore, the same effect as the effect of the first embodiment can be obtained. Further, according to the second embodiment, in a structure having a plurality of pairs of memory pillars connected through the joint portions, the same effect as that of the first embodiment can be obtained.

3. Third Embodiment

A third embodiment has a structure when the lower pillar LMP and the middle pillar MMP according to the second embodiment are simultaneously formed. Specifically, in the third embodiment, a connection between the source line and the memory pillar MP is different from the connection in the second embodiment. Further, in the third embodiment, a structure of the lower joint portion LJU is different from the structure in the second embodiment. Other structures are substantially the same as the structures in the second embodiment. In the following, the semiconductor memory device 1 according to the third embodiment will be described focusing on differences from the second embodiment.

Figure 24:
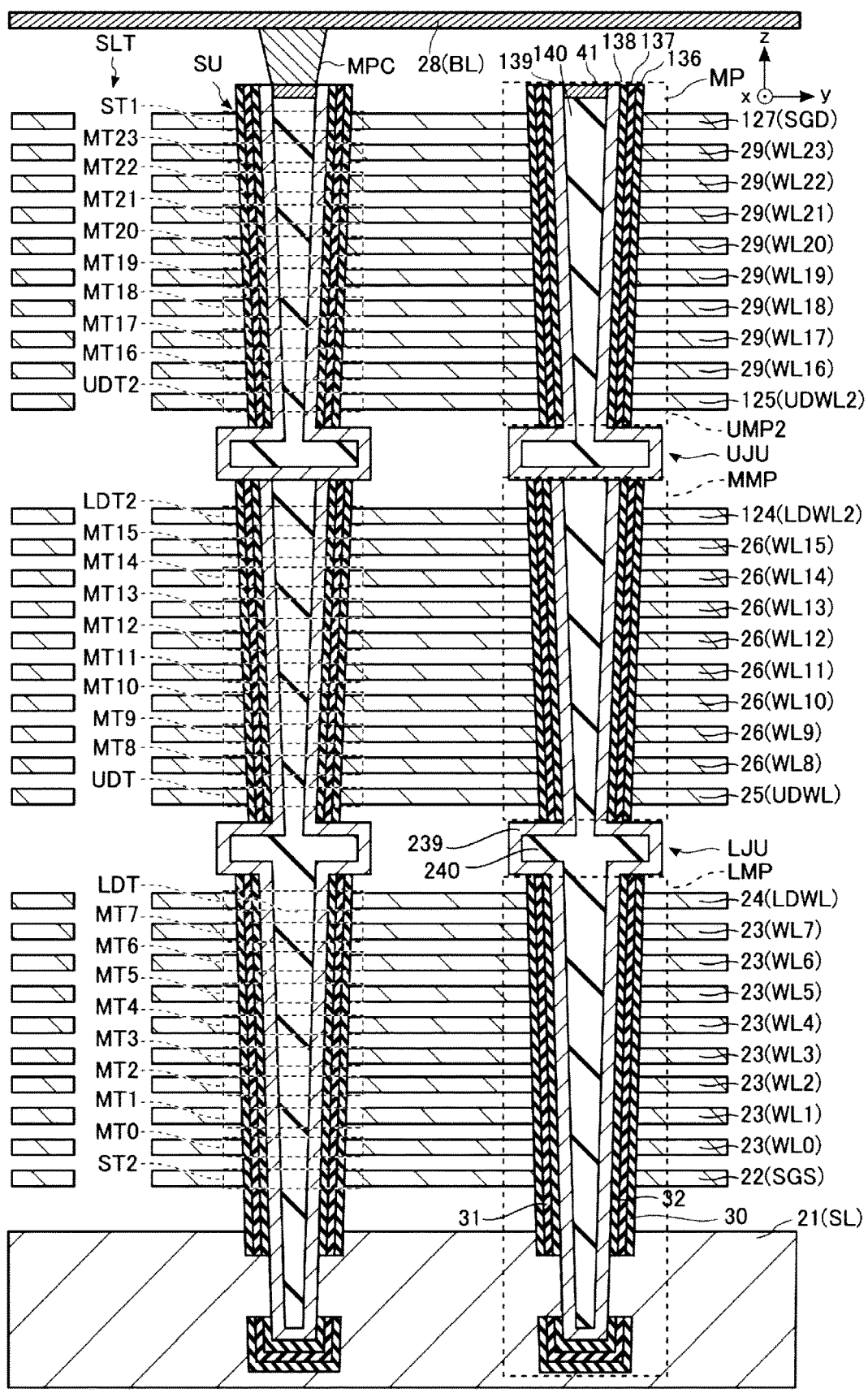
FIG. 24 is a sectional view illustrating an example of a sectional structure of the memory cell array in the semiconductor memory device according to a third embodiment.

The third embodiment will be described with reference to FIG. 24. FIG. 24 illustrates an example of a sectional structure of the memory cell array 10 in the semiconductor memory device 1 according to the third embodiment. FIG. 24 illustrates the same portion as FIG. 23 of the second embodiment. In the following, differences from the explanation described with reference to FIG. 23 will be mainly described. In FIG. 24, for easy understanding of the drawing, insulator layers may be omitted.

Here, in order to distinguish the third embodiment from the description in the second embodiment, the portions referred to as the semiconductor layers 33 and 39 in the second embodiment are referred to as a semiconductor layer 239 in the third embodiment. Similarly, the portions referred to as the core members 34 and 40 in the second embodiment are connected with each other, and may be referred to as a core member 240 in the third embodiment. This is because, in the third embodiment, the lower pillar LMP and the middle pillar MMP are collectively formed and thus the semiconductor layers 33 and 39 and the core members 34 and 40 are also collectively formed.

In the third embodiment, the bottom portion of the memory pillar MP is disposed in the conductor layer 21. In the bottom portion of the memory pillar MP, a part of the portion of the conductor layer 21 is in contact with the semiconductor layer 239 and the conductor layer 21. That is, in a part of the portion of the bottom portion of the memory pillar MP that is disposed in the conductor layer 21, the block insulating film 30, the insulating film 31, and the tunnel insulating film 32 are removed. The semiconductor layer 239 and the conductor layer 21 are electrically connected to each other, and have the same functions as the functions in the second embodiment except that shapes are different from each other.

Further, in the third embodiment, since the lower pillar LMP and the middle pillar MMP are collectively formed, a shape of the lower joint portion LJU is different from the shape in the second embodiment. In the lower joint portion LJU, the bottom portion of the semiconductor layer 39 is connected over the entire surface in the second embodiment, and on the other hand, in the third embodiment, the center portion of the bottom portion of the semiconductor layer 239 is divided by the core member 240. The lower joint portion LJU in the third embodiment also has the same function as the function in the second embodiment, except for the shape.

According to the third embodiment, the lower joint portion LJU and the upper joint portion UJU have the same structure as the joint portion JU according to the first embodiment. Therefore, the same effect as the effect of the first embodiment can be obtained. Further, according to the third embodiment, with a structure in which the semiconductor layer 239 is partially disposed in the conductor layer 21, the same effect as that of the first embodiment can be obtained.

4. Other Modification Examples

In the first to third embodiments, the memory cell array 10 may have another structure. For example, the memory pillar MP may have a structure in which a pillar functioning as the select gate line SGD and a pillar functioning as the word line WL are connected to each other. The inside of the slit SLT may be configured with a plurality of types of insulators. The number of the bit lines BL overlapping with each memory pillar MP may be any number.

In the drawings used for the descriptions of the first to third embodiments, an example in which the sectional structure of each memory pillar MP has a circular shape is illustrated. On the other hand, the sectional structure of each memory pillar MP may have an oval shape, and may have any shape.

In this specification, "connection" indicates electrical connection, and does not exclude, for example, connection through another component. "Electrical connection" may be connection through an insulator as long as an operation can be performed similarly to an operation in electrical connection. "Substantially uniform" includes an error due to a variation in manufacturing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a plurality of conductor layers separated from each other in a first direction; and
  a first pillar, extending through the plurality of conductor layers in the first direction, that includes a first columnar portion, a second columnar portion, and a middle portion interposed between the first columnar portion and the second columnar portion,
  wherein a width of the middle portion in a second direction crossing the first direction is larger than a width of the first columnar portion in the second direction and larger than a width of the second columnar portion in the second direction,
  wherein the first columnar portion includes a first core member extending in the first direction, a first semiconductor layer provided on an outer periphery of the first core member, and a first charge storage layer provided on an outer periphery of the first semiconductor layer,
  wherein the first charge storage layer is located between the plurality of conductor layers and the first semiconductor layer,
  wherein the second columnar portion includes a second core member extending in the first direction, a second semiconductor layer provided on an outer periphery of the second core member, and a second charge storage layer provided on an outer periphery of the second semiconductor layer, wherein the second charge storage layer is located between the plurality of conductor layers and the second semiconductor layer, wherein the middle portion includes a third core member and a third semiconductor layer provided on an outer periphery of the third core member, wherein the first semiconductor layer is in contact with the third semiconductor layer on a first side of the third semiconductor layer, wherein the second semiconductor layer is in contact with the third semiconductor layer on a second side of the third semiconductor layer opposite to the first side, wherein the second semiconductor layer and the third semiconductor layer are formed as a continuous film, wherein the first core member is in contact with the third core member via the third semiconductor layer on a third side of the third core member, wherein the second core member is in contact with the third core member on a fourth side of the third core member opposite to the third side, and wherein the first charge storage layer is spaced from the second charge storage layer.

2. The semiconductor memory device according to claim 1, wherein the second semiconductor layer and the third semiconductor layer are formed of a first material that includes polycrystalline silicon.

3. The semiconductor memory device according to claim 2, wherein the polycrystalline silicon is undoped.

4. The semiconductor memory device according to claim 1, wherein the first columnar portion includes a first insulator layer and a second insulator layer, wherein the second columnar portion includes a third insulator layer and a fourth insulator layer, wherein the first insulator layer is spaced from the third insulator layer, wherein the second insulator layer and the fourth insulator layer are not in contact with each other, wherein, in the first columnar portion,
the first semiconductor layer is in contact with the first insulator layer in the second direction,
the first insulator layer is interposed between the first charge storage layer and the first semiconductor layer, and
the first charge storage layer is interposed between the second insulator layer and the first insulator layer, and wherein, in the second columnar portion,
the second semiconductor layer is in contact with the third insulator layer in the second direction,
the third insulator layer is interposed between the second charge storage layer and the second semiconductor layer, and
the second charge storage layer is interposed between the fourth insulator layer and the third insulator layer.

5. The semiconductor memory device according to claim 4, wherein the middle portion includes a fifth insulator layer that is in contact with the third semiconductor layer.

6. The semiconductor memory device according to claim 5, wherein the first columnar portion includes a sixth insulator layer that is in contact with the first semiconductor layer, and wherein the second columnar portion includes a seventh insulator layer that is in contact with the second semiconductor layer.

7. The semiconductor memory device according to claim 6, wherein the first pillar extends in the first direction, wherein the third semiconductor layer includes a first portion extending in the second direction, a second portion extending in the second direction, and a third portion extending in the first direction and provided between the first portion and the second portion, and wherein the first portion and the second portion include portions facing the plurality of conductor layers in the first direction.

8. The semiconductor memory device according to claim 7, wherein the second portion of the third semiconductor layer covers an upper end of the sixth insulator layer in the first direction.

9. The semiconductor memory device according to claim 7, wherein the third portion of the third semiconductor layer is laterally offset from the first semiconductor layer by a first distance in the second direction.

10. The semiconductor memory device according to claim 9, wherein the third portion of the third semiconductor layer provided in the middle portion is laterally offset from the second semiconductor layer provided in the second columnar portion by a second distance in the second direction.

11. The semiconductor memory device according to claim 9, wherein the first distance is equal to or greater than a total thickness of the first insulator layer, the first charge storage layer, and the second insulator layer in the second direction.

12. The semiconductor memory device according to claim 1, wherein each of intersection portions of the plurality of conductor layers and the first pillar functions as a transistor.

13. The semiconductor memory device according to claim 12, further comprising:

a plurality of second pillars that extend through the plurality of conductor layers, wherein each of intersection portions of the plurality of conductor layers and the plurality of second pillars functions as a transistor.

* * * * *